United States Patent
Ho et al.

(10) Patent No.: US 9,577,067 B2
(45) Date of Patent: Feb. 21, 2017

(54) METAL GATE AND MANUFUACTURING PROCESS THEREOF

(71) Applicant: TAIWAN SEMICONDUCTOR MANUFACTURING COMPANY LTD., Hsinchu (TW)

(72) Inventors: Wei-Shuo Ho, New Taipei (TW); Chang-Yin Chen, Taipei (TW); Chai-Wei Chang, New Taipei (TW); Tsung-Yu Chiang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 13 days.

(21) Appl. No.: 14/463,953

(22) Filed: Aug. 20, 2014

(65) Prior Publication Data

US 2016/0056262 A1   Feb. 25, 2016

(51) Int. Cl.
*H01L 21/8234* (2006.01)
*H01L 29/78* (2006.01)
*H01L 29/66* (2006.01)
*H01L 21/4763* (2006.01)
*H01L 29/49* (2006.01)
*H01L 29/51* (2006.01)

(52) U.S. Cl.
CPC ... *H01L 29/66545* (2013.01); *H01L 21/47635* (2013.01); *H01L 21/823468* (2013.01); *H01L 29/4966* (2013.01); *H01L 29/66553* (2013.01); *H01L 29/66636* (2013.01); *H01L 29/7848* (2013.01); *H01L 29/513* (2013.01); *H01L 29/518* (2013.01); *H01L 2924/0002* (2013.01)

(58) Field of Classification Search
CPC ................................................. H01L 21/47635
See application file for complete search history.

(56) References Cited

U.S. PATENT DOCUMENTS

| | | | | |
|---|---|---|---|---|
| 8,450,216 B2* | 5/2013 | Teo | .................... | H01L 21/28518 257/E21.5 |
| 2011/0062501 A1* | 3/2011 | Soss | .................. | H01L 21/28114 257/288 |
| 2013/0187236 A1* | 7/2013 | Xie | ..................... | H01L 29/4966 257/369 |

(Continued)

FOREIGN PATENT DOCUMENTS

CN   WO 2013/078882 A1 *  6/2013   ....... H01L 29/66545

*Primary Examiner* — Stephen W Smoot
(74) *Attorney, Agent, or Firm* — WPAT, P.C., Intellectual Property Attorneys; Anthony King

(57) ABSTRACT

Some embodiments of the present disclosure provide a semiconductor device including a semiconductive substrate, a metal gate including a metallic layer proximal to the semiconductive substrate. A dielectric layer surrounds the metal gate. The dielectric layer includes a first surface facing the semiconductive substrate and a second surface opposite to the first surface. A sidewall spacer surrounds the metallic layer with a greater longitudinal height. The sidewall spacer is disposed between the metallic layer and the dielectric layer. An etch stop layer over the metal gate comprises a surface substantially coplanar with the second surface of the dielectric layer. The etch stop layer has a higher resistance to etchant than the dielectric layer. A portion of the etch stop layer is over the sidewall spacer.

18 Claims, 21 Drawing Sheets

(56) References Cited

U.S. PATENT DOCUMENTS

| 2015/0035055 A1* | 2/2015 | Wang | H01L 29/6659 |
| | | | 257/339 |
| 2015/0041905 A1* | 2/2015 | Xie | H01L 29/6656 |
| | | | 257/369 |
| 2015/0118836 A1* | 4/2015 | Lin | H01L 29/66583 |
| | | | 438/586 |

* cited by examiner

METAL GATE AND MANUFUACTURING PROCESS THEREOF

BACKGROUND

In today's fast advancing of technology for semiconductor manufacturing, integration levels are increasing, device features are reduced, and greater demands are increasing for device performance.

As a semiconductor industry has progressed into nanometer technology process nodes in pursuit of higher device density, higher performance, and lower costs, challenges from fabrication issues have also appeared.

In a fabrication process, a chemical mechanical planarizing (CMP) is used to polish a surface of a semiconductive structure. However, CMP process will induce dishing on the surface and complicate a manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
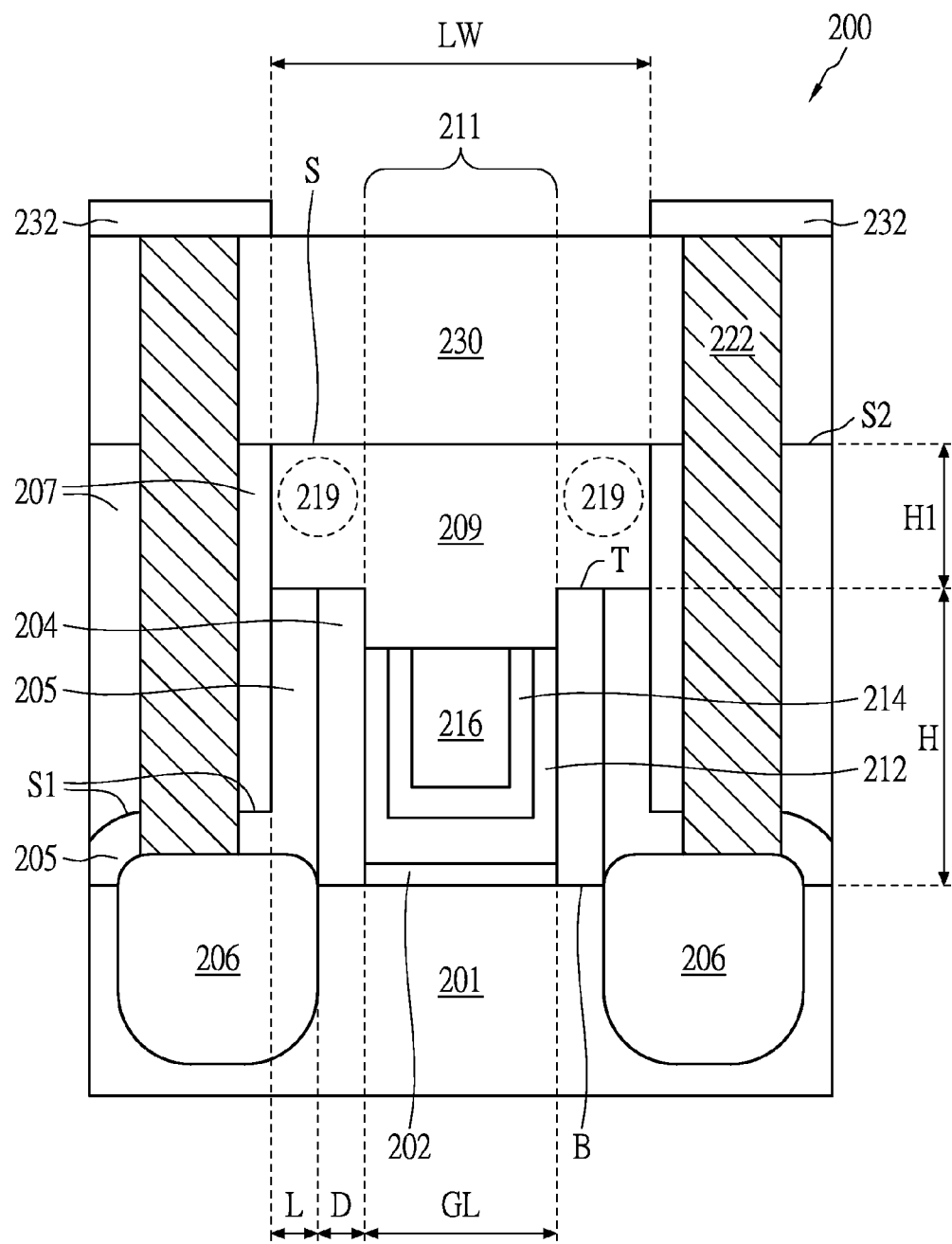
FIG. 1 is a cross sectional view of a metal gate structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross sectional view of a semiconductor device 200 in accordance to some embodiments of the present disclosure. The semiconductor device 200 includes a semiconductive substrate 201, a metal gate 211 positioned on semiconductive substrate 201, a dielectric layer 207 surrounding the metal gate 211, an etch stop layer 209 over the metal gate 211, a sidewall spacer 204 between the metal gate 211 and the dielectric layer 207. In some embodiments, metal gate 211 includes metallic layer (212, 214, 216). In some embodiments, the semiconductor device 200 is symmetric on either side of the metal gate 211.

In some embodiments, semiconductive substrate 201 includes an elementary semiconductor such as silicon or germanium in crystal, polycrystalline, or an amorphous structure; a compound semiconductor including gallium arsenic, gallium phosphide, silicon carbide, indium phosphide, indium arsenide, and/or indium antimonide; an alloy semiconductor including SiGe, GaAsP, AlGaAs, AlInAs, GaInAs, GaInP, and/or GaInAsP; any other suitable material; and/or combinations thereof. In one embodiment, the alloy semiconductive substrate 201 may have a gradient, uniform, or variable SiGe concentration profile feature in which the Si and Ge composition change from one ratio at one location to another ratio at another location. In another embodiment, an alloy SiGe is formed over a silicon substrate. In another embodiment, a SiGe substrate is strained. Furthermore, semiconductive substrate 201 may be a semiconductor on insulator, such as silicon on insulator (SOI), or a thin film transistor (TFT). In some examples, semiconductive substrate 201 may include a doped epitaxy layer or a buried layer. In other examples, semiconductive substrate 201 may have a multilayer compound structure. In some embodiments, a metal gate 211 is constructed in a FinFET, and thereby semiconductive substrate 201 is a semiconductor fin partially embedded in an insulating layer (not shown).

The semiconductive substrate 201 may include various doping configurations depending on design specification as known in the art. In some embodiments, semiconductive substrate 201 may include doped portions. The doped portions may be doped with p-type or n-type dopants. For example, the doped portions may be doped with p-type dopants, such as boron or $BF_2$; n-type dopants, such as phosphorus or arsenic; and/or combinations thereof. The doped portions may be formed directly on semiconductive substrate 201, in a P-well structure, in an N-well structure, in a dual-well structure, or using a raised structure. In some embodiments, semiconductive substrate 201 may also compose of some suitable elementary semiconductor, such as diamond or germanium. In some embodiments, semiconductive substrate 201 may also include a suitable compound semiconductor, such as silicon carbide gallium, indium arsenide, arsenide, or indium phosphide. Furthermore, semiconductive substrate 201 may also have a suitable alloy semiconductor, such as silicon germanium carbide, gallium arsenic phosphide, or gallium indium phosphide. For performance enhancement, semiconductive substrate 201 may include at least one epitaxial layer with strain and/or include a silicon-on-insulator (SOI) structure. Semiconductive substrate 201 may further include various active regions. For examples, the active regions may be configured for an N-type metal-oxide-semiconductor transistor device (NMOS) and other active regions configured for a P-type metal-oxide-semiconductor transistor device (PMOS).

In some embodiments, semiconductor device 200 may include a doped region 206 with different conductive type than semiconductive substrate 201. The doped region 206 may be an epitaxial layer on each side of metal gate 211. The epitaxial layer may be a raised source and drain regions. Forming source/drain region by epitaxial growths imparts tensile strain or compressive strain to a channel region. In some embodiments, an NMOS structure may include epitaxially regrown source and drain in doped regions 206, imparting a tensile strain to a channel region; a PMOS structure may include epitaxially regrown source and drain in doped regions 206, imparting a compressive strain to a channel region. Doped region 206 in a drain/source region may include various doping profile.

On top of semiconductive substrate 201 and in proximity to doped regions 206 is a gate dielectric 202. Gate dielectric 202 may be a thin film. Gate dielectric 202 may compose a high-k dielectric layer or combination thereof. The gate dielectric 202 may comprise hafnium oxide (HfOZ), hafnium silicon oxide (HfSiO), hafnium silicon oxynitride (HfSiON), hafnium tantalum oxide (HMO), hafnium titanium oxide (HMO), hafnium Zirconium oxide (HfZrO), metal oxides, metal nitrides, metal silicates, transition metal-nitrides, transition metal-silicates, transition metal-oxides, oxynitrides of metals, metal aluminates, silicon oxide, silicon nitride, silicon oxy-nitride, Zirconium silicate, Zirconium aluminate, aluminum oxide, Zirconium oxide, titanium oxide, hafnium dioxide-alumina (HfO2iAl2O3) alloy, other suitable high-k dielectric materials, and/or combinations thereof. Examples of metal oxides for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or mixtures thereof. Gate dielectric 202 may include an interfacial layer to reduce damages between gate dielectric 202 and semiconductive substrate 201. The interfacial layer may comprise silicon oxide.

As shown in FIG. 1, on top of gate dielectric 202 is a metal gate 211. In some embodiments, metal gate 211 may also be referred to as a metal gate structure. The metal gate 211 may include several metallic layers (212, 214, 216). In an embodiment, metallic layer 212 is a metal film, metallic layer 214 is a work function layer, and metallic layer 216 is a wetting layer. A work function layer is in a middle to tune some work function values of metal gate 211. In some embodiments, a work function layer is TiN, TaN, or titanium aluminum nitride (TiAlN). A metallic layer (212, 214, 216) may include aluminum or tungsten, or other suitable materials. In an embodiment, a metallic layer 216 may further include a Ti layer that functions as a wetting layer and an Al layer to fill in a remainder of metal gate 211. A sequence of metallic layer (212, 214, 216) in metal gate 211 may be different. For example, in an embodiment, metallic layer 212 is a wetting layer and metallic layer 216 is a work function layer. In another embodiment, metallic layer 216 is a wetting layer, metallic layer 214 is a work function layer, and metallic layer 212 is a metal film. A number of metallic layers (212, 214, 216) in metal gate 211 may also be different according to different design requirement. For example, in an embodiment, metal gate 211 has only one metallic layer 216 which may be a barrier layer. In another embodiment, metal gate 211 may include four metallic layers, in which metallic layer 214 may further include two work function layers with different work function. People having ordinary skill in the art shall understand that various sequence or combination of metallic layers (212, 214, 216) may be assembled and is not exceeding the scope of the present disclosure.

Dielectric layer 207 and second dielectric layer 230 may include materials such as silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (Applied Materials of Santa Clara, Calif.), Xerogel, Aerogel, polyimide, Parylene, BCB (bis-benzocyclobutenes), Flare, SiLK (Dow Chemical, Midland, Mich.), non-porous materials, porous materials, and/or combinations thereof. In some embodiments, dielectric layer 207 and second dielectric layer 230 may include a high density plasma (HDP) dielectric material (e.g., HDP oxide) and/or a high aspect ratio process (HARP) dielectric material (e.g., HARP oxide). In some embodiments, dielectric layer 207 is a planarized dielectric film.

It is understood that dielectric layer 207 and second dielectric layer 230 may include one or more dielectric materials and/or one or more dielectric layers. Dielectric layer 207 is surrounding the metal gate 211. A first surface S1 of dielectric layer 207 is facing semiconductive substrate 201. The first surface S1 is at a bottom of dielectric layer 207. In an embodiment, first surface S1 is between semiconductive substrate 201 and dielectric layer 207. In another embodiment, first surface S1 is between dielectric layer 207 and a contact etch stop layer 205. A second surface S2 of dielectric layer 207 is opposite to the first surface S1. The second surface S2 is at a top of dielectric layer 207. Second surface S2 may also be referred to as an upper surface. In some embodiments, second surface S2 is between dielectric layer 207 and second dielectric layer 230.

Still referring to FIG. 1, a sidewall spacer 204 may be positioned on each side of metal gate 211. In an embodiment, doped region 206 may be aligned with an outer edge of sidewall spacer 204. The sidewall spacer 204 is composed of a nitride material (e.g., silicon nitride). Sidewall spacer 204 may include a dielectric material such as silicon nitride, silicon nitride doped with carbon, silicon carbide, silicon oxide, silicon oxynitride, silicon oxynitride doped with carbon, other suitable materials, and/or combinations thereof. The sidewall spacer 204 may be used to offset doped region 206.

In some embodiments, sidewall spacer 204 is higher than metal gate 211. In some embodiments, sidewall spacer 204 is between metal gate 211 and dielectric layer 207. In some embodiment, sidewall spacer 204 is between metallic layer 212 and dielectric layer 207. In another embodiment, sidewall spacer 204 is positioned between metal gate 211 and a contact etch stop layer 205. Sidewall spacer 204 has a height H measured from a top T of sidewall spacer 204 to a bottom B landing on semiconductive substrate 201. The bottom B of sidewall spacer 204 is landing on semiconductive substrate 201, and the top T of sidewall spacer 204 is opposite to the bottom.

A top T of sidewall spacer 204 is recessed from second surface S2 of dielectric layer 207 with a predetermined distance H1. In other words, the top T of sidewall spacer 204 is lower than second surface S2 of dielectric layer 207 by the predetermined distance H1. In some embodiments, predetermined distance H1 may be between about 10 Å and about 200 Å. In some embodiments, predetermined distance H1 may be between about 200 Å and about 300 Å. In some embodiments, predetermined distance H1 may be between about 300 Å and about 400 Å. In some embodiments, predetermined distance H1 may be between about 400 Å and about 500 Å. In some embodiments, predetermined distance H1 may be between about 500 Å and about 600 Å. In some embodiments, predetermined distance H1 may be between about 600 Å and about 700 Å. In some embodiments, there is a ratio R between height H of sidewall spacer 204 and predetermined distance H1. The ratio R of height H to predetermined distance H1 may be any suitable range from about 10 to 14, from about 14 to 19, or from about 19 to 22.

Sidewall spacer 204 on either side of metal gate 211 may have a sidewall thickness D. In an embodiment, the sidewall thickness D may be between about 1 Å and about 50 Å, between about 50 Å and about 100 Å, or between about 100 Å and about 150 Å.

In FIG. 1, contact etch stop layer 205 or etch stop layer 209 may be a nitrogen containing layer. In some embodiments, contact etch stop layer 205 or etch stop layer 209 includes silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen and/or other suitable materials. Composition of contact etch stop layer 205 or etch stop layer 209 may be selected based upon etching selectivity to one or more additional features of semiconductor device 200. In the present embodiment, the etch stop layer 209 is a middle contact etch stop layer (MCESL) composed of silicon nitride, and contact etch stop layer 205 is a bottom contact etch stop layer (BCESL). The BCESL may compose of the same or different dielectric materials as those in the MCESL. In some embodiments, contact etch stop layer 205 may have any suitable range of thickness L from about 1 Å to about 50 Å, from about 50 Å to about 100 Å, or from about 100 Å to about 150 Å. The etch stop layer 209 is covering the metal gate 211. A surface S at a top of etch stop layer 209 is substantially coplanar with a second surface S2 of dielectric layer 207. In some embodiments, etch stop layer 205, 209 may have higher resistance to etchant for dielectric layer 207. In some embodiments, contact etch stop layer 205 may have higher resistance to etchant for doped regions 206. Such different resistance is for selective etching which would be discussed later. A portion 219 of etch stop layer 209 covers sidewall spacer 204 and contact etch stop layer 205 on either side of metal gate 211. In some embodiments, the etch stop layer 209 is covering a metal gate 211, sidewall spacer 204, and contact etch stop layer 205. In some embodiments, the etch stop layer 209 has a lateral width LW. There are two interfaces between etch stop layer 209 and dielectric layer 207. Lateral width LW is a distance between those two interfaces. Lateral width LW is greater than a gate length GL of metal gate 211 as shown in FIG. 1. In some embodiments, on top of dielectric layer 207 and etch stop layer 209 is a second dielectric layer 230. Second dielectric layer 230 is laterally laid on dielectric layer 207 and etch stop layer 209. A portion 219 of etch stop layer 209 is between sidewall spacer 204 and second dielectric layer 230.

In some embodiments, dielectric layer 207 and second dielectric layer 230 may surround a conductive plug 222. Conductive plug 222 may electrically couple to a doped region 206. Conductive plug 222 may be connected to metal contacts 232 and other semiconductor devices (not shown). Conductive plug 222 is composed of conductive materials. In an embodiment, conductive plug 222 penetrates through a second dielectric layer 230, a dielectric layer 207, and a contact etch stop layer 205 to reach doped region 206 in semiconductive substrate 201. The doped region 206 is raised above the semiconductive substrate 201. In an embodiment, doped region 206 is in contact with conductive plug 222 in dielectric layer 207. In another embodiment, doped region 206 is in contact with conductive plug 222 in contact etch stop layer 205 as shown in FIG. 1. In some embodiments, the conductive materials forming conductive plug 222 include aluminum, copper, titanium nitride, tungsten, titanium, tantalum, tantalum nitride, nickel silicide, cobalt silicide, TaC, TaSiN, TaCN, TiAl, TiAlN, other suitable materials, and/or combinations thereof.

Figure 2:
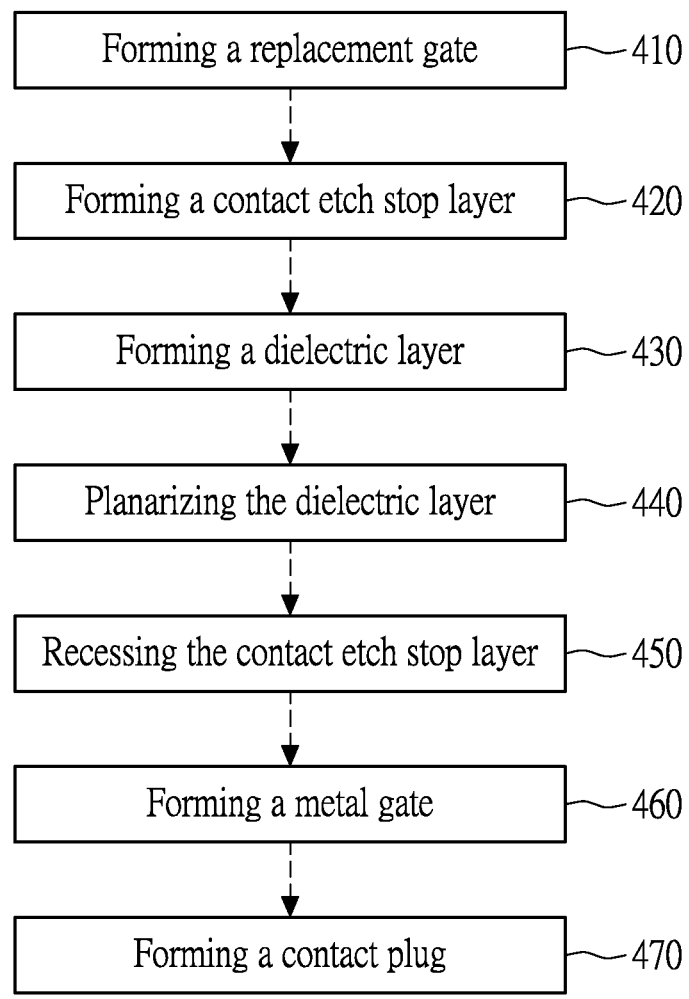
FIG. 2 is an operational flow of a method for manufacturing a metal gate structure, in accordance with some embodiments of the present disclosure.

The present disclosure also provides a method for manufacturing a semiconductor device 200 described herein. Referring to FIG. 2, several operations in the method for manufacturing semiconductor device 200 are listed from operation 410 to operation 470. Operation 410 is for forming of a replacement gate. Operation 420 is for forming of a contact etch stop layer. Operation 430 is for forming of dielectric layer. Operation 440 is for planarizing dielectric layer. Operation 450 is for recessing contact etch stop layer. Operation 460 is for forming metal gate. Operation 470 is for forming contact plug.

Figure 3:
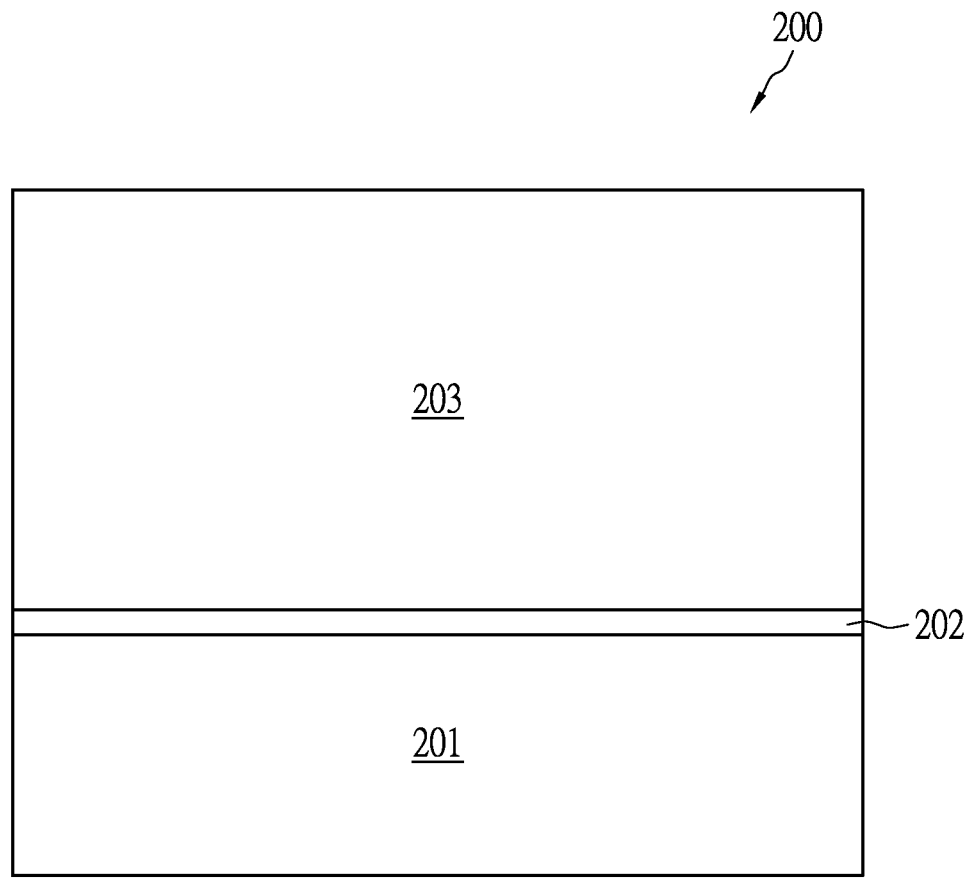
FIG. 3 to FIG. 21 are cross sectional views of an operation in a method for manufacturing a metal gate structure, in accordance with some embodiments of the present disclosure.

FIG. 3 shows a semiconductive substrate 201 provided with a gate dielectric 202, which is covering over the semiconductive substrate 201. In an embodiment, gate dielectric 202 is a thin film formed by a suitable deposition process. A replacement gate 203 is covering on top of gate dielectric 202. In an embodiment, gate dielectric 202 and replacement gate 203 are sequentially deposited over semiconductive substrate 201 by some deposition processes. In some embodiments, replacement gate 203 is covering on top of semiconductive substrate 201. A deposition process may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, spin-on coating, other suitable methods, and/or combinations thereof.

Figure 4:
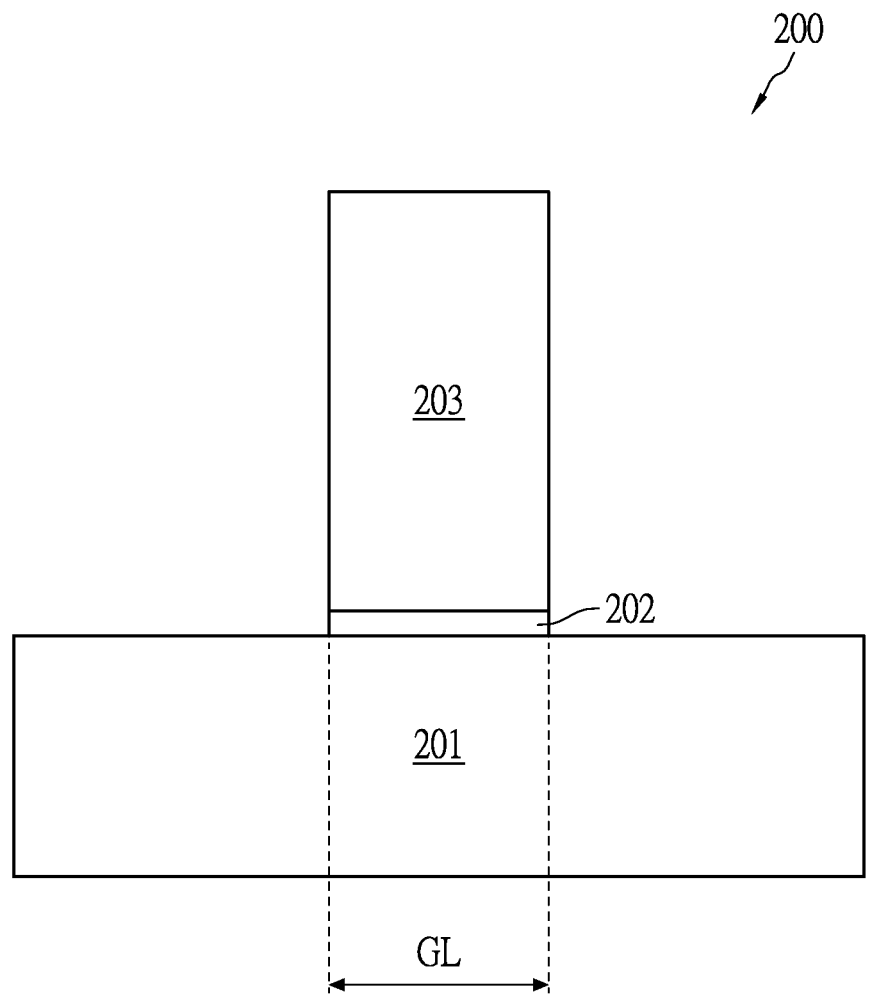

Referring to FIG. 4, gate dielectric 202 and replacement gate 203 are formed. Replacement gate 203 may be patterned to have a gate length GL. In some embodiments, gate dielectric 202 may be patterned after replacement gate 203 is patterned. Gate dielectric 202 and replacement gate 203 may be formed using any suitable process, including some processes described herein. In one example, a layer of photoresist is formed over replacement gate 203 by a suitable process, such as spin-on coating, and patterned to form a photoresist feature by a proper photolithography patterning method. The photoresist feature can then be transferred by an etching process to some underlying layers (i.e., gate dielectric 202) to form replacement gate 203 and gate dielectric 202. The photoresist may be stripped thereafter. In another example, a hard mask (not shown) may be formed over replacement gate 203; a patterned photoresist layer is formed on the hard mask; the pattern of the photoresist layer is transferred to the hard mask and then transferred by an etching process to replacement gate 203 and gate dielectric 202 to form replacement gate 203 and gate dielectric 202. It is understood that the above examples do not limit the processing steps that may be utilized to form replacement gate 203 and gate dielectric 202. It is further understood that replacement gate 203 may comprise additional dielectric layers and/or conductive layers. For example, replacement gate 203 may comprise hard mask layers, interfacial layers, capping layers, diffusion/barrier layers, other suitable layers, and/or combinations thereof.

A photolithography process may also be implemented or replaced by other proper methods such as maskless photolithography, electron-beam writing, ion-beam writing, and/or molecular imprint. In some embodiments, photolithography process may include forming a photoresist layer over replacement gate 203, exposing photoresist to a pattern, performing a post-exposure bake process, and developing the resist to form a masking element including the photoresist. Replacement gate 203 may then be etched using reactive ion etching (RIE) processes and/or other etching processes. An etching process may include dry etching, wet etching, and/or other etching methods (e.g., reactive ion etching). The etching process may also be either purely chemical (plasma etching), purely physical (ion milling), and/or combinations thereof.

A dry etching process may be implemented in an etching chamber. Thickness dimensions of different features in some embodiments may be controlled by adjusting some process parameters including a radio frequency (RF) source power, a bias power, electrode size, a pressure, a flow rate, etching duration, a wafer temperature, other suitable process parameters, and/or combinations thereof. A dry etching process may implement an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr, He and/or $CHBR_3$), iodine-containing gas, other suitable gases and/or plasmas, and/or combinations thereof. In some embodiments, the dry etching process utilizes an $O_2$ plasma treatment and/or an $O_2/N_2$ plasma treatment. Further, the dry etching process may be performed for a suitable duration.

A wet etching process may utilize a hydrofluoric acid (HF) solution for a HF dipping process. In some embodiments, a wet etching process may apply a diluted hydrofluoric acid to an intermediate semiconductor structure. In some embodiments, the wet etching process includes exposing to a hydroxide solution containing ammonium hydroxide, diluted HF, deionized water, and/or other suitable etchant solutions.

Figure 5:
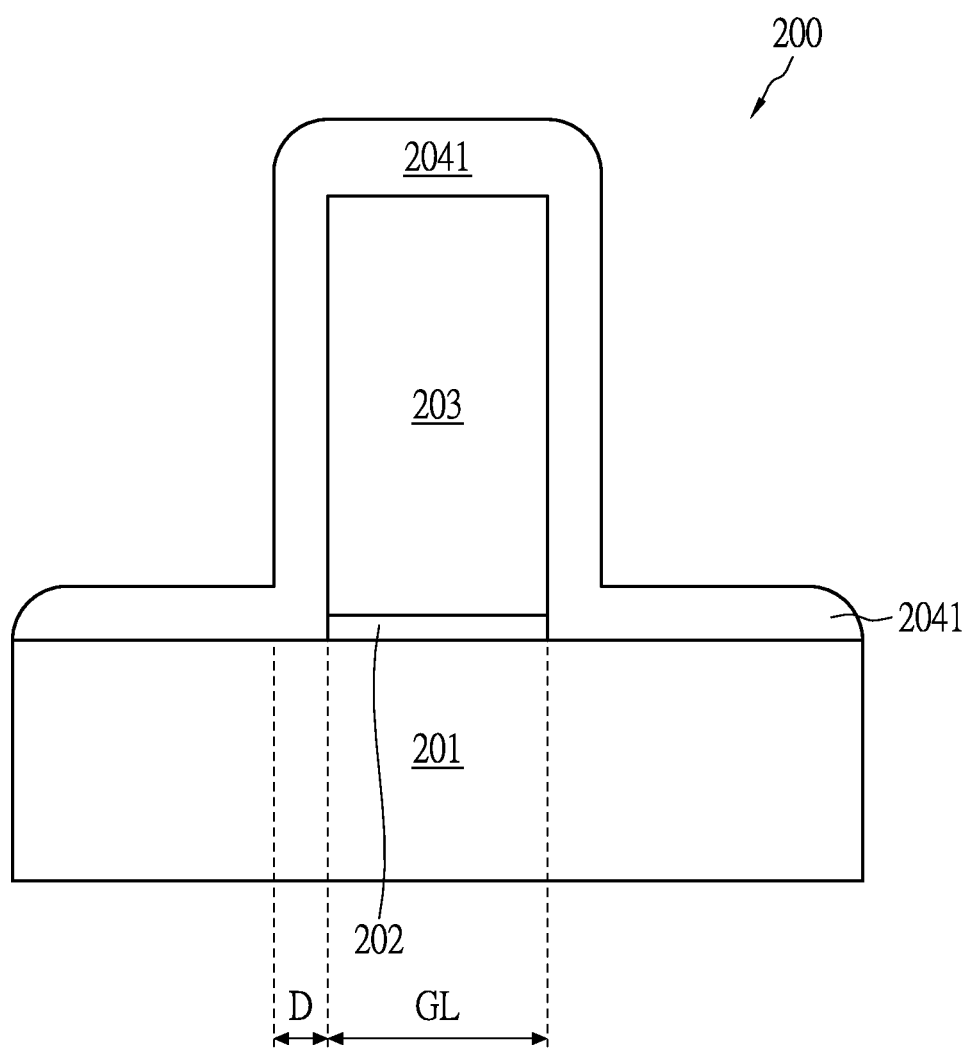
Figure 6:
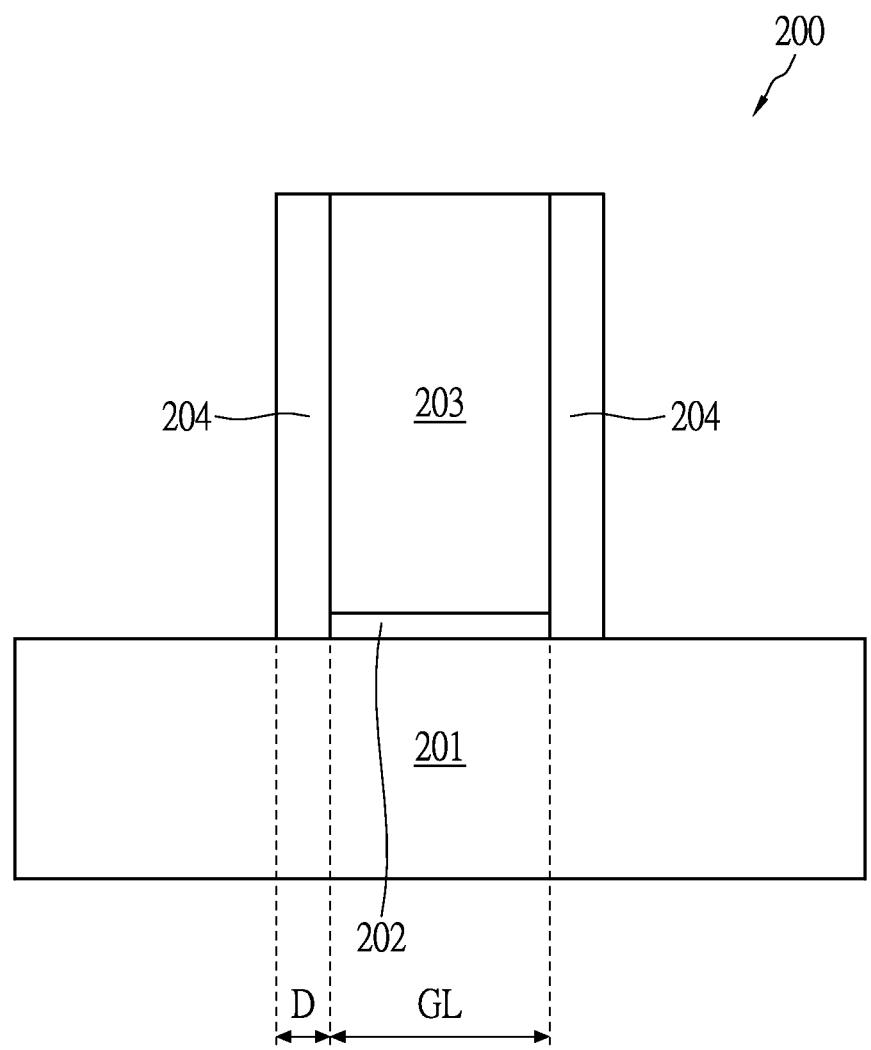

FIG. 5 and FIG. 6 demonstrate an operation of forming a sidewall spacer 204. Sidewall spacer 204 may be formed using any suitable process, including some processes described herein. In FIG. 5, a layer 2041 is covering comformally on replacement gate 203 and semiconductive substrate 201 by a deposition process. In some embodiments, layer 2041 is replaced with dielectric materials such as silicon nitride, silicon nitride doped with carbon, silicon carbide, silicon oxide, silicon oxynitride, nitride with lower K, silicon oxynitride doped with carbon, other suitable materials, and/or combinations thereof. In FIG. 6, layer 2041 is etched by any suitable etching process to form sidewall spacers 204 on either side of replacement gate 203. In some embodiments, an anisotropic etching process by a dry etching process may be used without photolithography. Some portions of layer 2041 deposited on top of replacement gate 203 and on semiconductive gate 201 may be etched faster than two portions of layer 2041 near either side of replacement gate 203. A sidewall thickness D may be controlled by adjusting some process parameters in the deposition process. The process parameters in CVD may include a radio frequency (RF) source power, a bias power, a pressure, a flow rate, a wafer temperature, other suitable process parameters, and/or combinations thereof.

Figure 7:
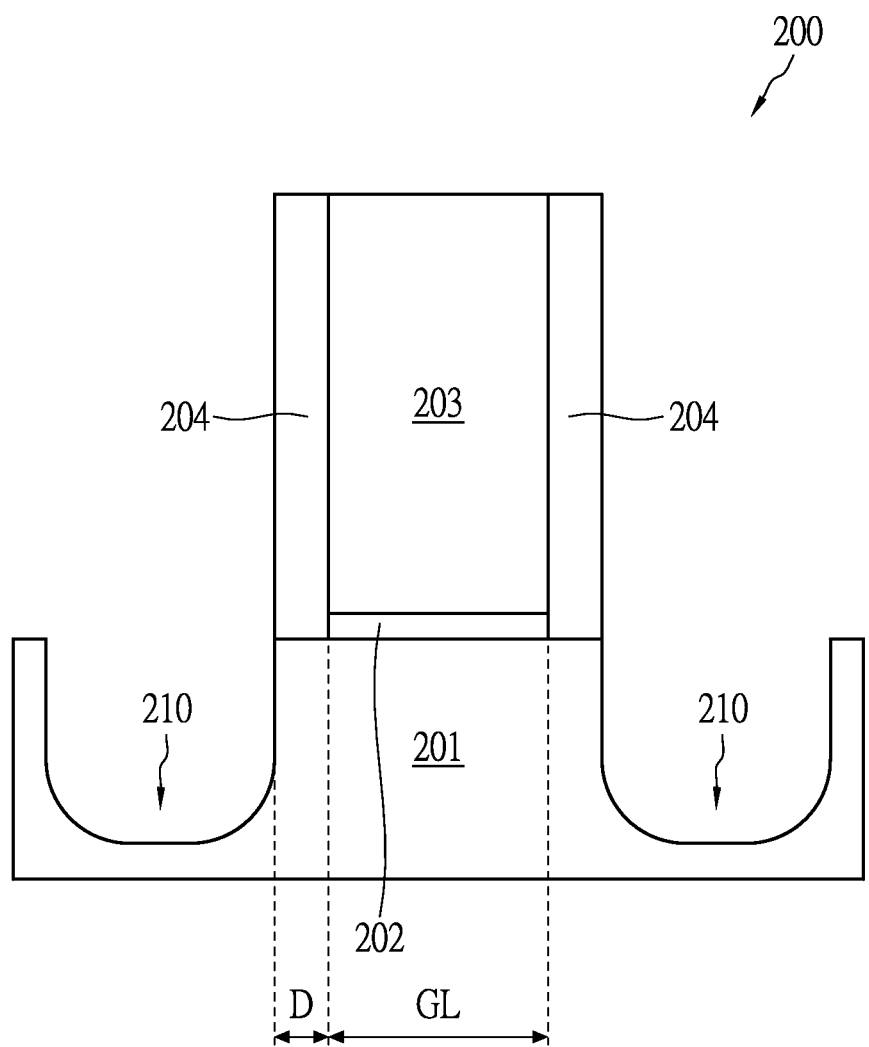
Figure 8:
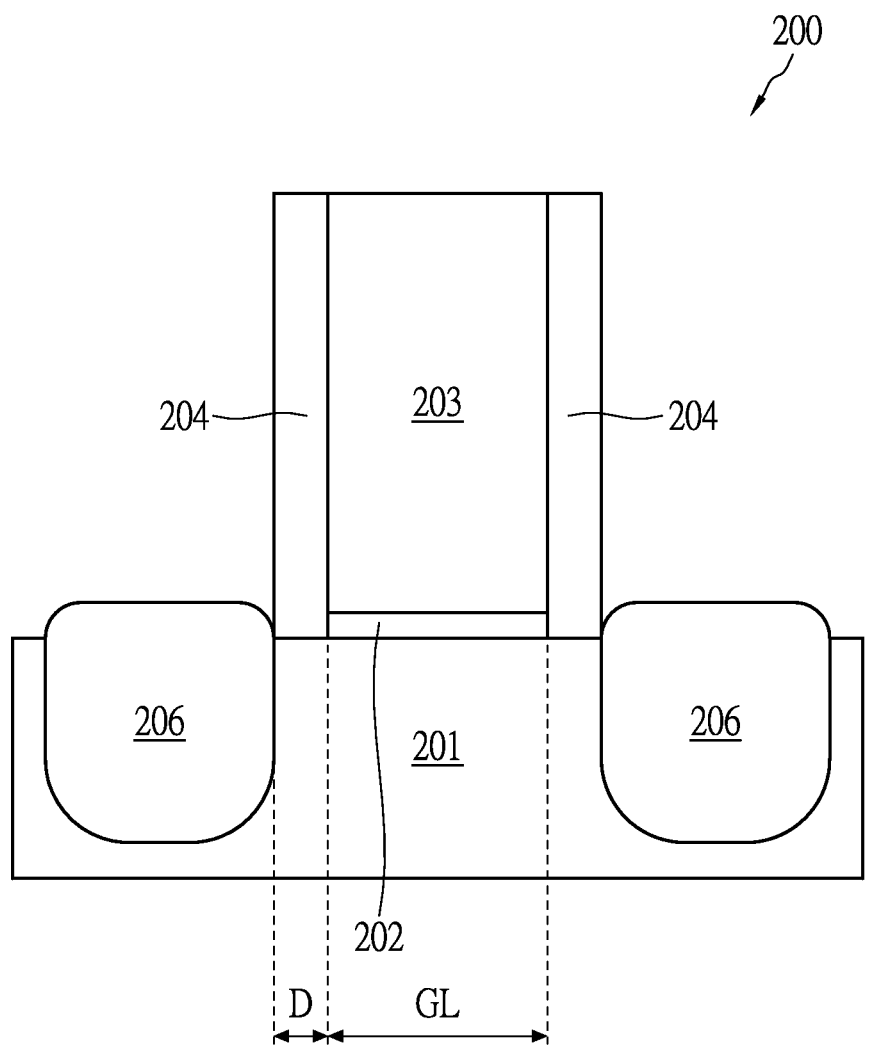

FIG. 7 and FIG. 8 illustrate a formation of doped region 206. Doped region 206 may be formed using any suitable process, including some processes described herein. In FIG. 7, recess region 210 is formed by a suitable etching process.

In some embodiments, a layer of photoresist is formed over semiconductive substrate 201 by a suitable process, and patterned to form a photoresist feature by a proper photolithography patterning method. The photoresist feature can then be transferred by an etching process to semiconductive substrate 201 to form recess region 210. The etching process may be a dry etch process or wet etch process, and/or combinations thereof. The photoresist may be stripped thereafter.

In FIG. 8, in some embodiments, recess region 210 may be filled by epitaxial growth. Some epitaxial growth may be a vapor-phase epitaxy (VPE), a metalorganic CVD (MOCVD), or a molecular-beam epitaxy (MBE). The epitaxial growth may produce a raised source/drain for doped region 206. The raised source/drains may be some epitaxy regions. In an embodiment, dopants are added to the epitaxy region during a growth (e.g., in-situ doping). Exemplary dopants include arsenic, phosphorous, antimony, boron, boron di-fluoride, and/or other possible impurities. For SiGe epitaxy, boron may be included by using diborane (B2H6) and BF2 gas. Boron doped in a SiGe may be accomplished by introducing boron-containing gas, in an in-situ fashion, during an epitaxial SiGe growth. Boron or other dopants may also be formed by implantation operations. In some embodiments, doped regions 206 are doped with p-type dopants, such as boron or BF2. In some embodiments, doped regions 206 are doped with n-type dopants. In some embodiments, for n-type dopants, phosphorus or arsenic may be used for an in-situ doping with SiC epitaxial growth. Methods other than epitaxial growth may be implemented. In some embodiments, a stress memorization technique (SMT), or other suitable regrowth operation may be used.

Figure 9:
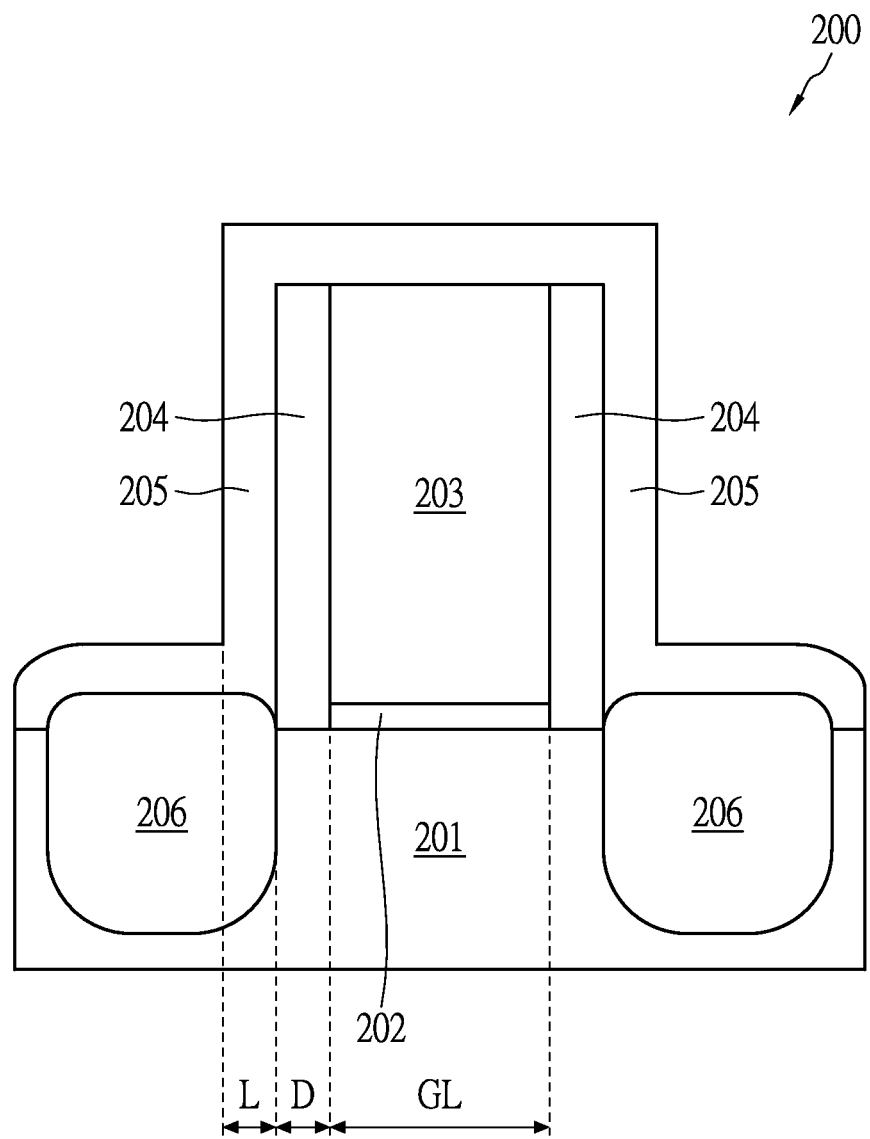

FIG. 9 illustrate a formation of contact etch stop layer 205. Contact etch stop layer 205 may be blanket deposited comformally over replacement gate 203, sidewall spacer 204, doped region 206, and semiconductive substrate 201 by any suitable deposition process. A thickness L of contact etch stop layer 205 may be controlled by adjusting some process parameters in a CVD process. The process parameters may be a total pressure, some reactant concentrations, a deposition temperature, and a deposition rate.

Figure 10:
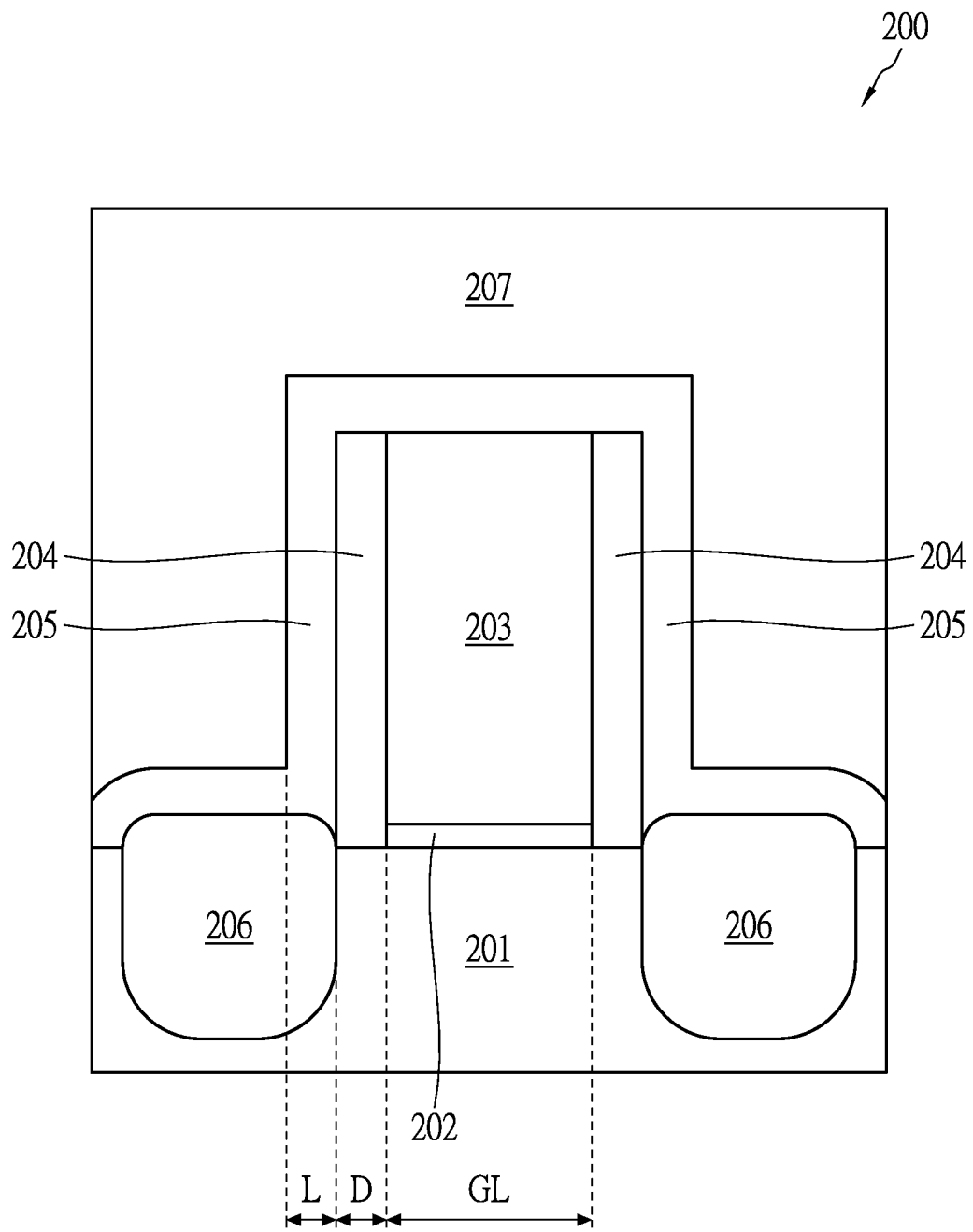

FIG. 10 illustrates a formation of dielectric layer 207. Dielectric layer 207 may be blanket deposited comformally over contact etch stop layer 205 by any suitable deposition process such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), and low-pressure chemical vapor deposition (LPCVD) process.

Figure 11:
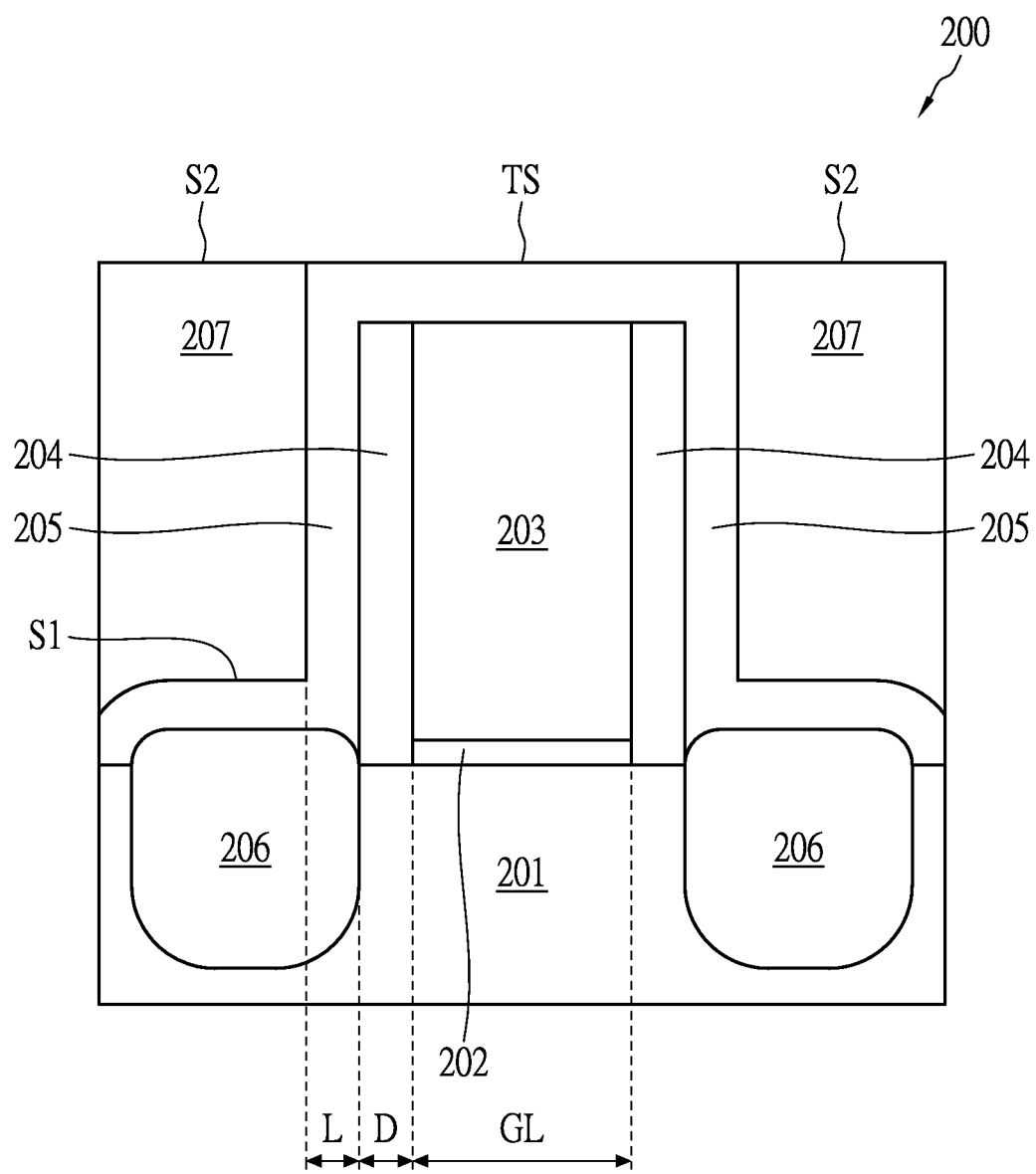

In FIG. 11, a suitable planarizing process is used. In some embodiments, dielectric layer 207 and a contact etch stop layer 205 are planarized. In some embodiments, dielectric layer 207 is planarized. Dielectric layer 207 and contact etch stop layer 205 are planarized such that a top of contact etch stop layer 205 are exposed. In an embodiment, dielectric layer 207 and contact etch stop layer 205 are planarized such that a top surface TS of contact etch stop layer 205 may be coplanar with second surface S2 of dielectric layer 207 as illustrated in FIG. 11. A planarizing process may be a chemical mechanical planarization (CMP) operation.

In chemical mechanical planarization (CMP), for different materials, different type of slurry may be used for planarization. For example, in some embodiments, oxide slury may be used for features containing oxide such as gate dielectric 202, dielectric layer 207, and second dielectric layer 230. In some embodiments, wet oxide etch may be included in processes involving etching dielectric layer 207.

Figure 12:
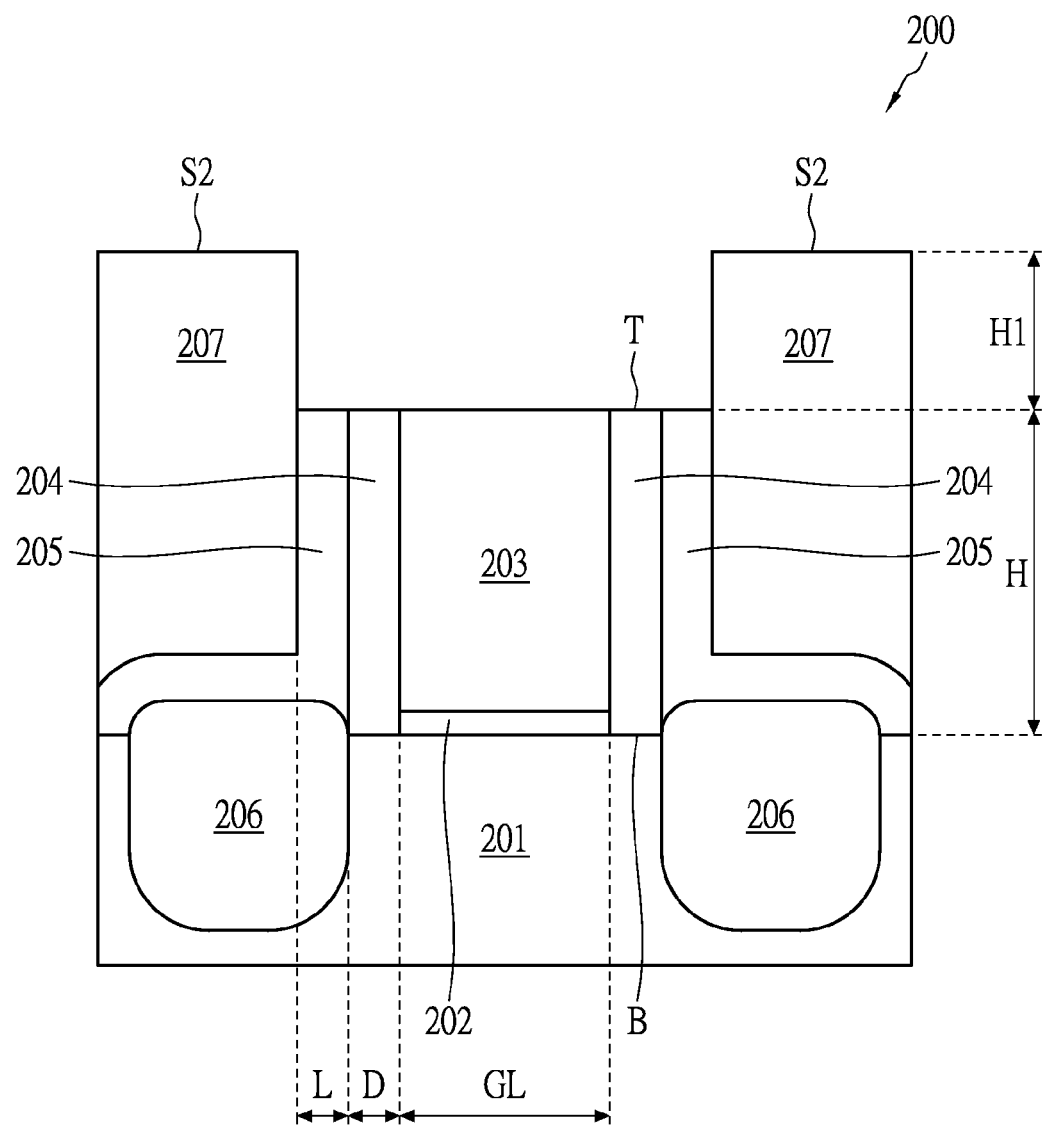

In FIG. 12, replacement gate 203, sidewall spacer 204, and contact etch stop layer 205 are recessed by a predetermined distance of H1 from second surface S2 of dielectric layer 207. The recessing may include some suitable etching processes. The etching processes may include some etching back operations. The etching processes may be one or more dry etching processes, wet etching processes, other suitable processes (e.g., reactive ion etching), and/or combinations thereof. In some embodiments, some etching processes may be a selective etching. In some embodiments, the selective etching demonstrating a sufficient higher etch rate on replacement gate 203 than on dielectric is within the contemplated scope of the present disclosure.

The selective etching may use an HBr and/or Cl2 as some etch gases. In some embodiments, a bias voltage used in the etching process may be adjusted to allow better control of an etching direction to attain desired etching profiles. In some embodiments, an etching process may include selective etching with slower etching rate for dielectric layer 207 than for replacement gate 203, sidewall spacer 204, and contact etch stop layer 205 such that dielectric layer 207 is higher than replacement gate 203, sidewall spacer 204, and contact etch stop layer 205. In some embodiments, a recessing operation may be by one or plurality of etching processes. Different etchant may be used for etching different compositions of materials. Different combination of process parameters for etching may be designed. In an embodiment, replacement gate 203, sidewall spacer 204, and contact etch stop layer 205 are all having a same height as a height H of sidewall spacer 204. Some etching processes may include etching back operation.

In FIG. 12, a recessing operation is illustrated. Referring to FIG. 2, a planarizing process in operation 440 is followed by a recessing in operation 450. Replacement gate 203 is to be replaced by metal gate 211 in subsequent operations. A dielectric layer 207 higher than metal gate 211 may prevent contact to metal gate 211 from other materials above dielectric layer 207. Recessing replacement gate 203 by a predetermined distance H1 from second surface S2 of dielectric layer 207 would allow metal gate 211 to be lower than second surface S2 by a predetermined distance H1. Having a predetermined distance H1 from second surface S2 may help to prevent other materials above dielectric layer 207 in contact with metal gate.

Figure 13:
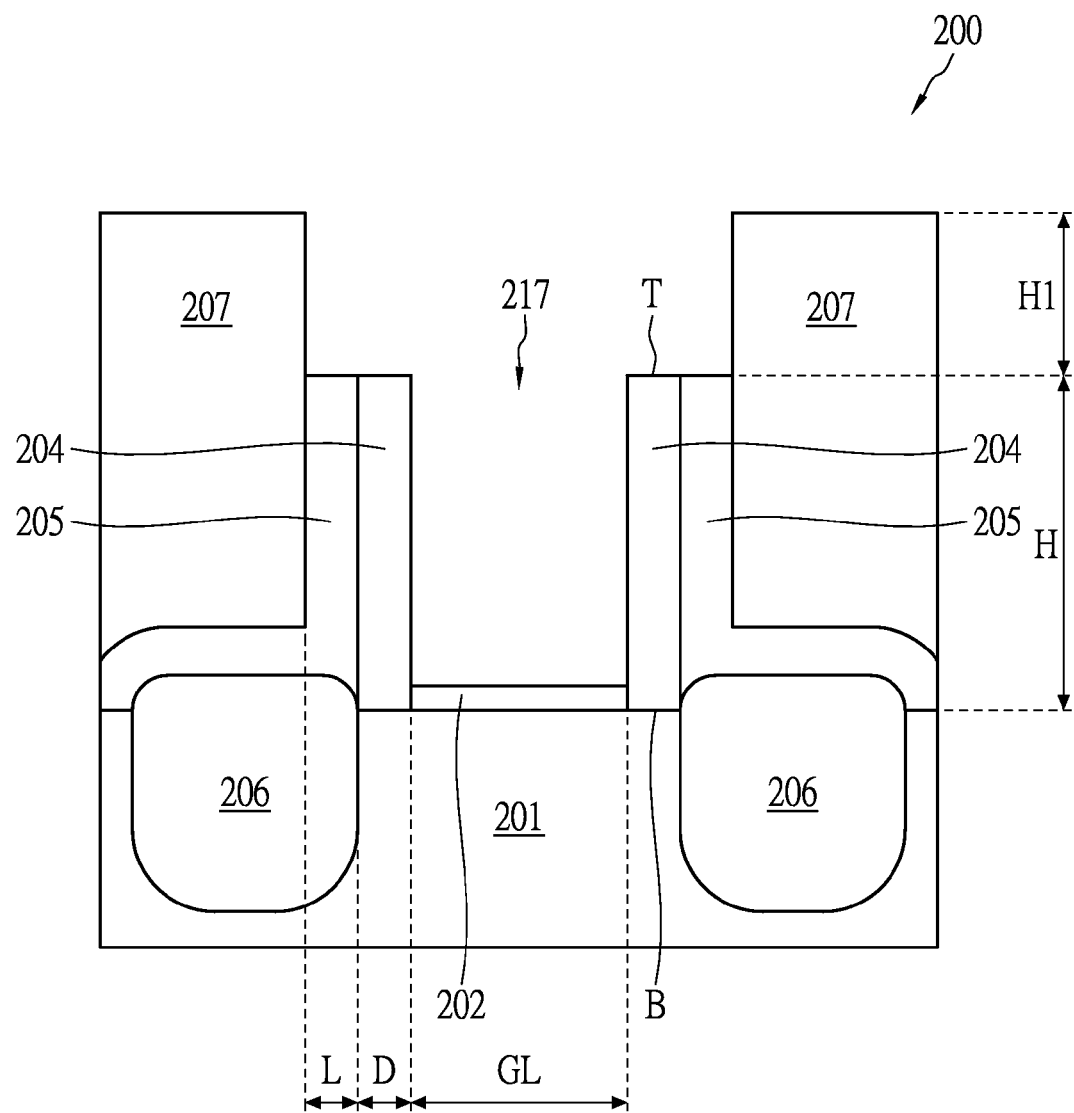

In FIG. 13, replacement gate 203 is removed to form an opening 217 by any suitable method such as etching process. In some embodiments, selective etching may be used to have a faster etching rate for replacement gate 203 than for other features such as sidewall spacer 204, contact etch stop layer 205, and dielectric layer 207. In some embodiments, selective etching may also use etchant that would attack replacement gate 203 in FIG. 12, and not attack gate dielectric 202 underneath. After a removal of replacement gate 203, gate dielectric 202 is exposed.

Figure 14:
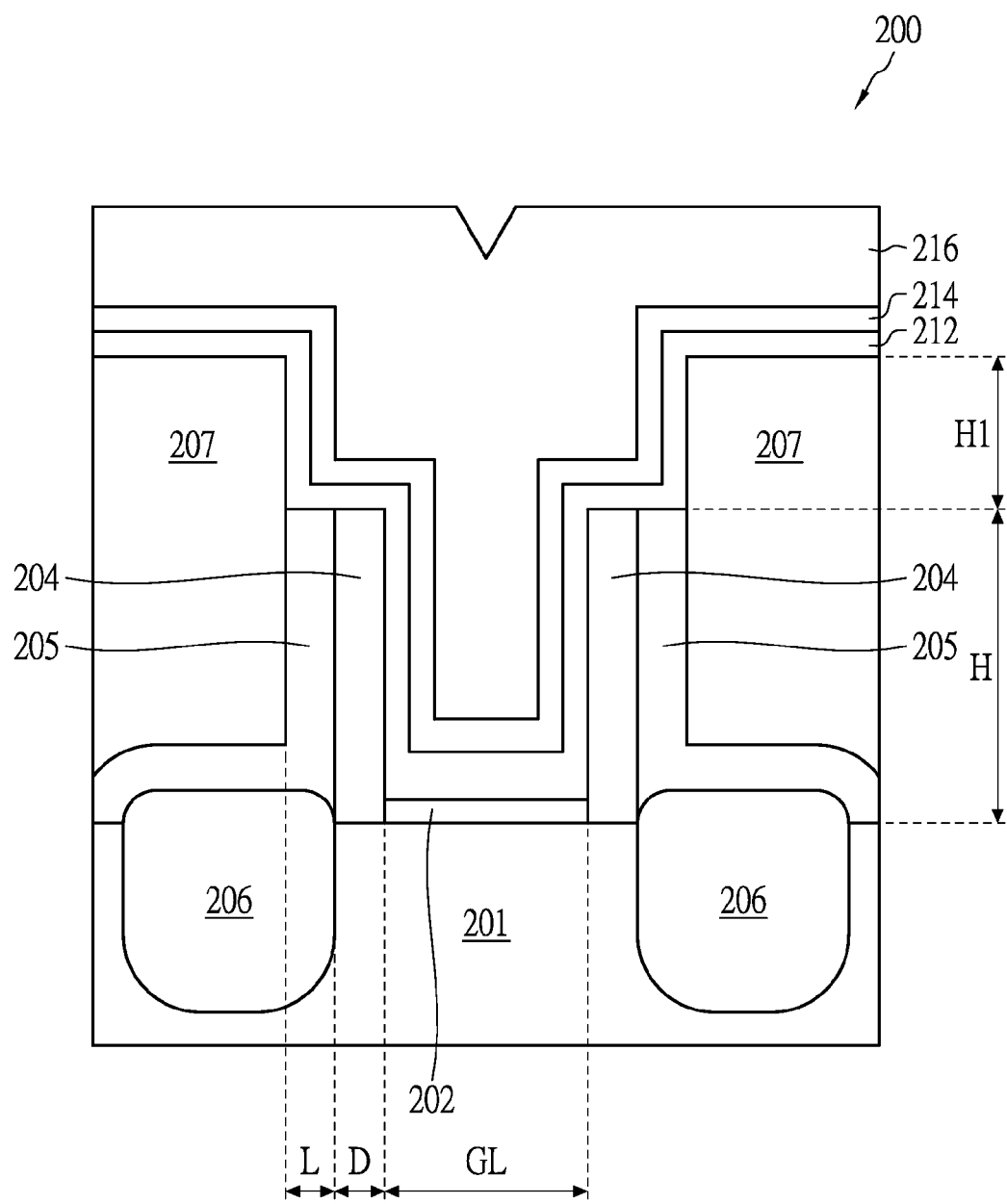
Figure 15:
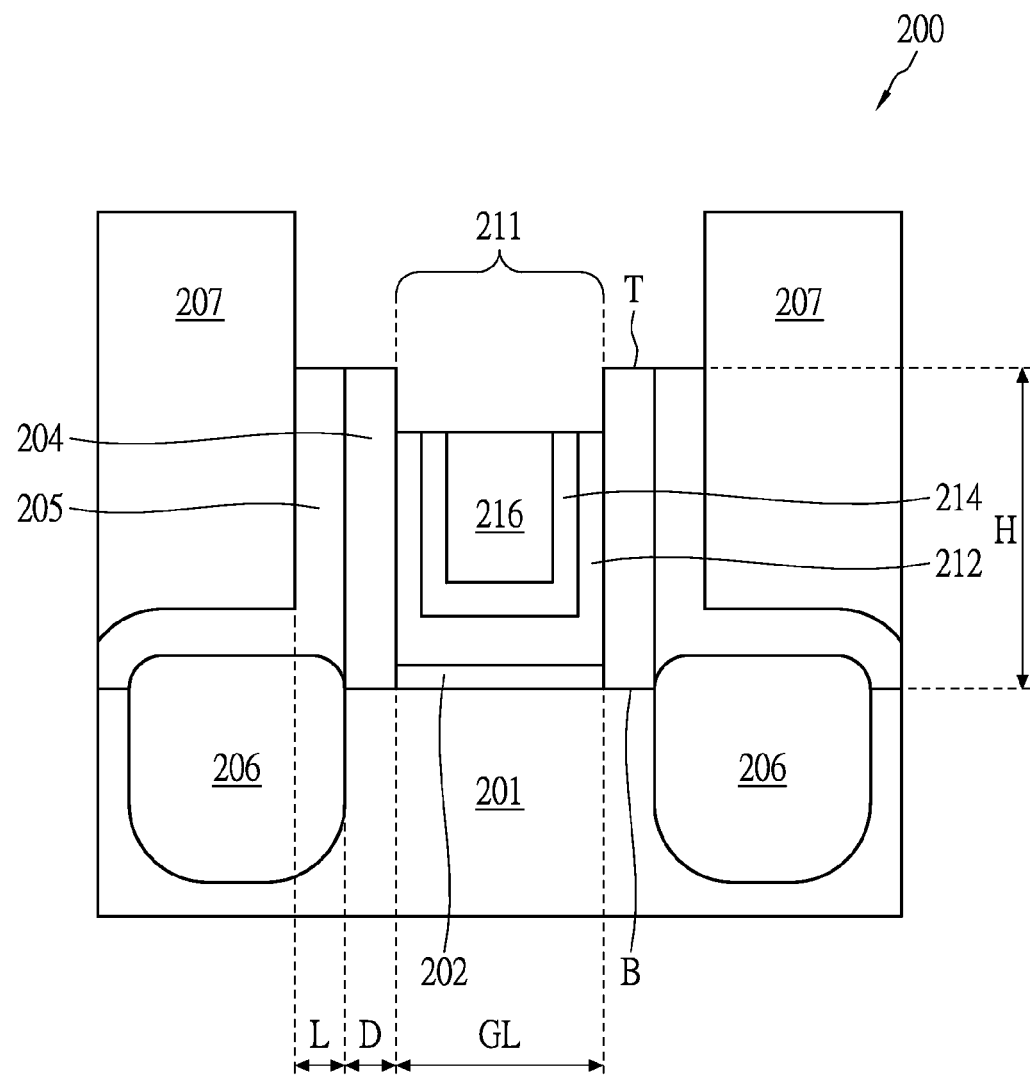

FIG. 14 and FIG. 15 illustrate a formation of metal gate 211. In FIG. 14, several metallic layers (212, 214, 216) are comformally covering gate dielectric 202, sidewall spacer 204, contact etch stop layer 205, and dielectric layer 207. In an embodiment, metallic layer 212 may deposit first by any suitable method of deposition process. Metallic layer 214 and metallic layer 216 may be deposit subsequently. In some embodiments, simultaneous deposition and etching may form metallic layer (212, 214, 216). In some embodiments, additional deposition processes may be performed for additional layers. Some deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, sputtering, plating, other suitable methods, and/or combinations thereof.

In some embodiments, metallic layer (212,214,216) may be a P-type work function metal for a PMOS device. For the P-type work function metal, TiN or WN, may be used in a deposition processes. For an N-type work function metal (N-metal), TiAl, TiAlN, or TaCN, may be used. In some embodiments, a work function layer may include some doped-conducting metal oxide materials. Some metal oxide materials include In2O3, SnO2, OsO2, RuO2, IrO2, ZnO, M002 and ReOO2. In some embodiments, metallic layer (212,214,216) may be a metal filling layer. The metal filling layer may include any suitable conductive material. The metal filling layer may be a doped polycrystalline silicon with doping. In some embodiment, the metal filling layer includes aluminum. It is understood that different layers may be formed above and/or below a work function layer and/or a metal filling layer, including liner layers, interface layers, seed layers, adhesion layers, etc. It is further understood that metallic layer (212, 214, 216) may each include one or more materials and/or one or more layers.

In FIG. 15, metallic layers (212, 214, 216) are recessed to form metal gate 211 by some suitable processes such as etching process. Metal gate 211 is recessed such that metallic layers (212, 214, 216) are exposed at a top of metal gate 211. Some etching processes may include etching back operations. In some embodiments, metallic layers (212, 214, 216) are recessed such that sidewall spacer 204, contact etch stop layer 205, and dielectric layer 207 are exposed. Metal gate 211 is over gate dielectric 202. In some embodiments, metal gates 211 are formed with a gate length GL. In some embodiments, metal gate 211 may be recessed below sidewall spacer 204. Metal gate 211 is selectively recessed by using some etchants that attack some materials in metal gate 211 but attack less for materials of sidewall spacer 204, contact etch stop layer 205, and dielectric layer 207.

Figure 16:
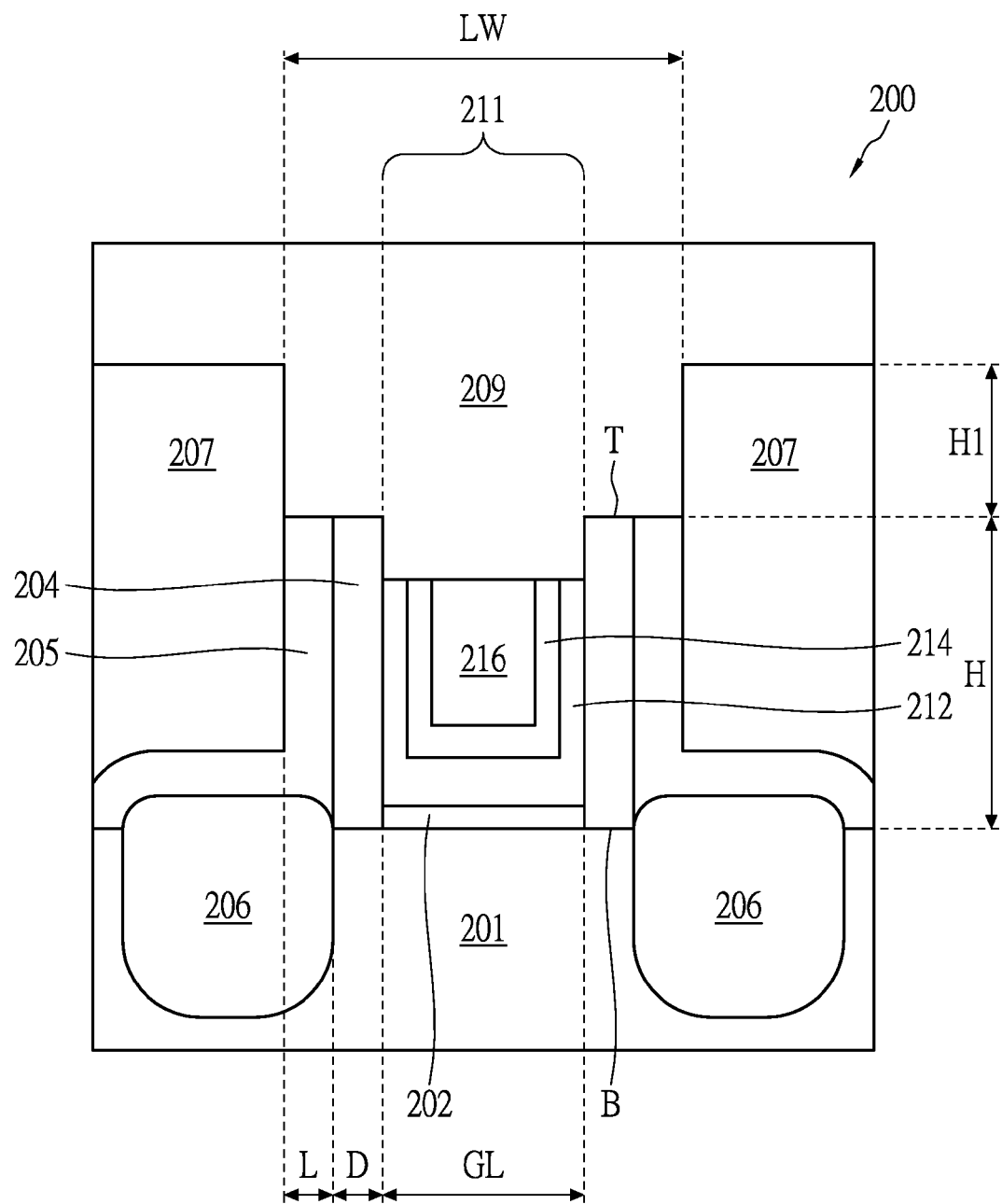
Figure 17:
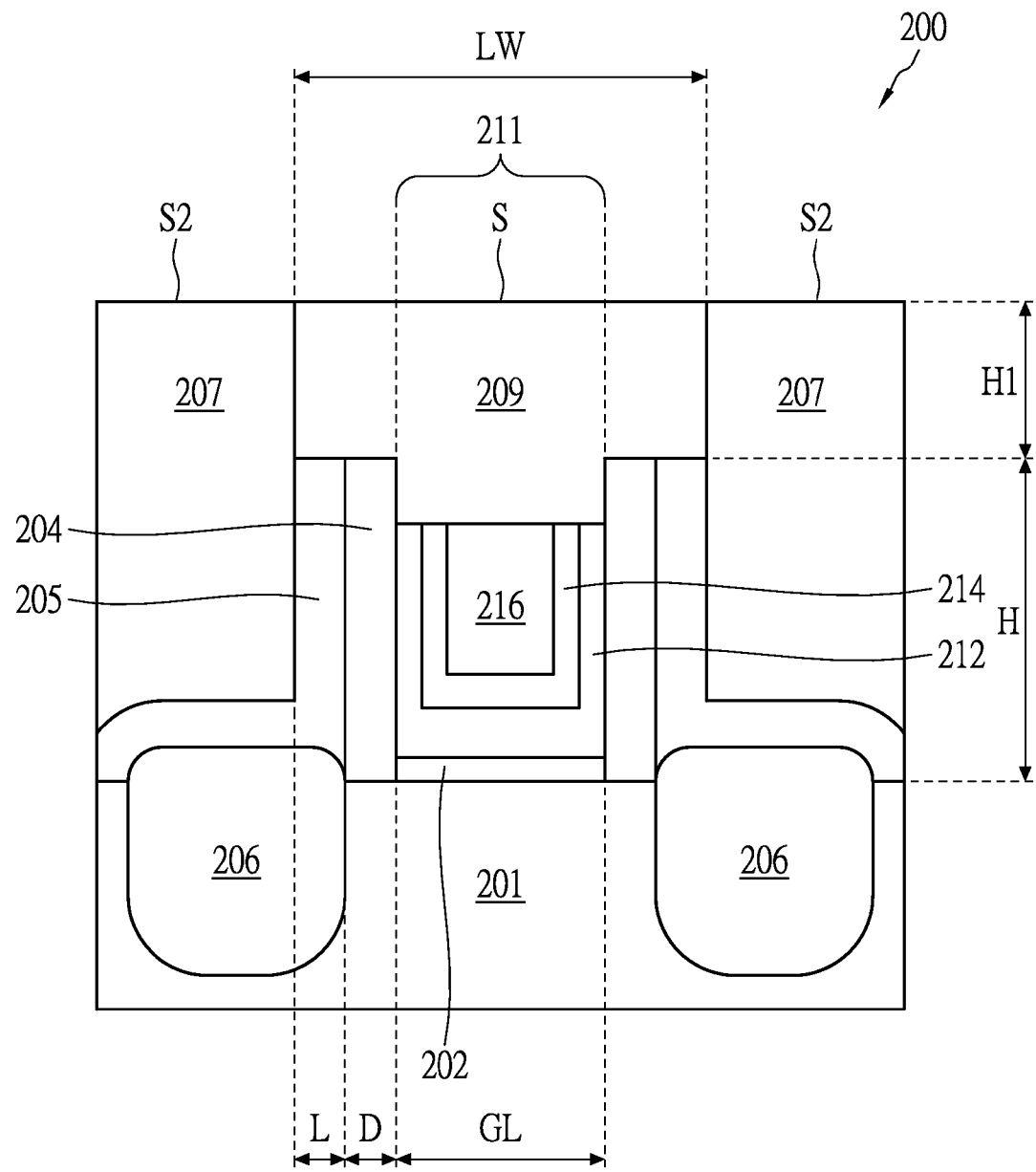

FIG. 16 and FIG. 17 illustrate a forming of etch stop layer 209. In FIG. 16, etch stop layer 209 are covering over metal gate 211, sidewall spacer 204, contact etch stop layer 205, and dielectric layer 207 by suitable method of deposition process. In some embodiments, etch stop layer 209 may be formed with component including nitrogen to form a nitrogen containing layer. In some embodiments, the nitrogen containing layer is a self-aligned silicide nitride.

FIG. 17 illustrate a planarizing of etch stop layer 209. In some embodiments, the planarizing of etch stop layer 209 is along second surface S2 of dielectric layer 207 such that a surface S at a top of etch stop layer 209 is coplanar with a second surface S2 of dielectric layer 207. Surface S and second surface S2 are a smooth or planar. In some embodiments, etch stop layer 209 has a lateral width LW. Lateral width LW is also a length of surface S.

Figure 18:
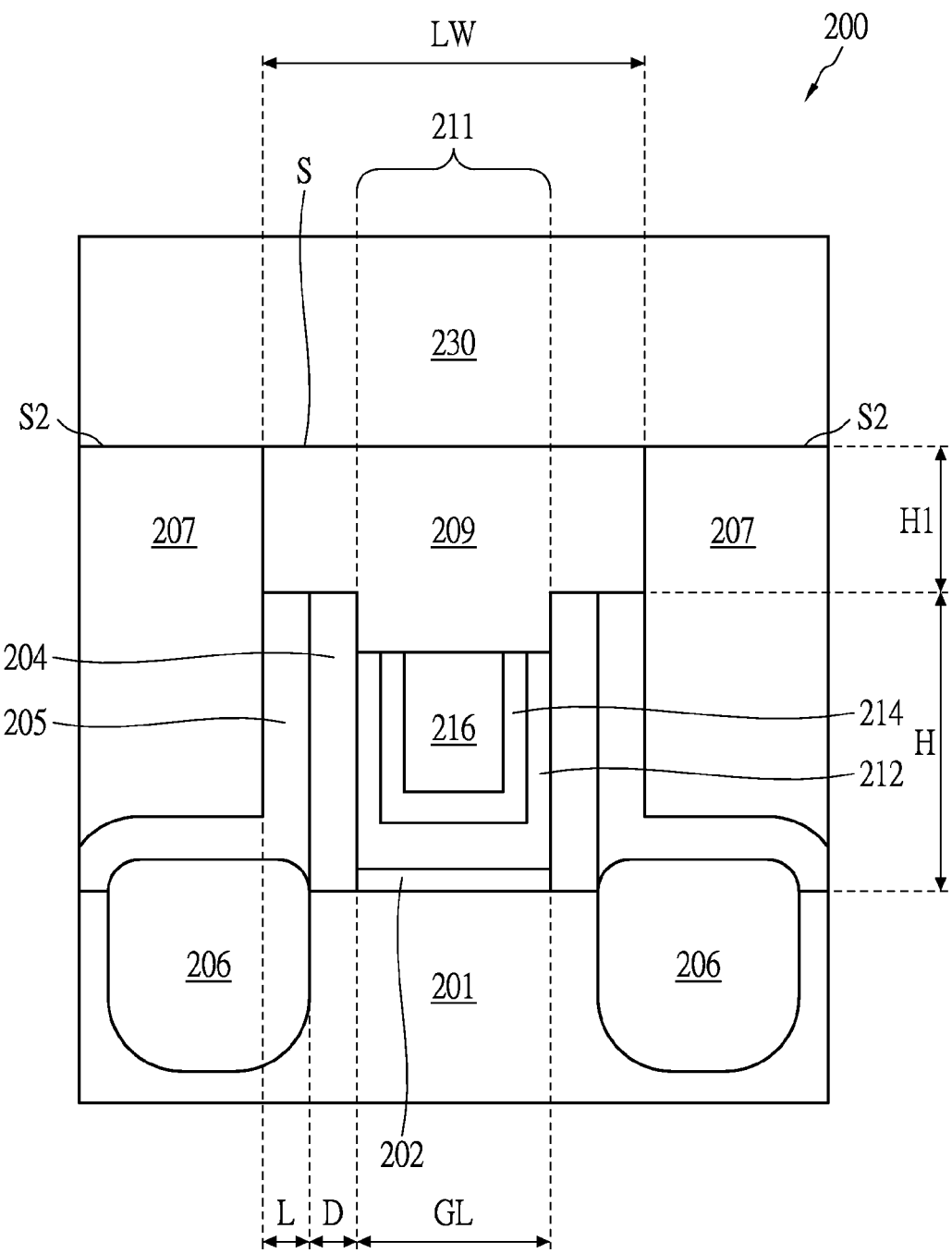

In FIG. 18, a second dielectric layer 230 is covering on top of dielectric layer 207 and etch stop layer 209 by a suitable method of deposition process. Some deposition methods may be chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), and low-pressure chemical vapor deposition (LPCVD) process.

Figure 19:
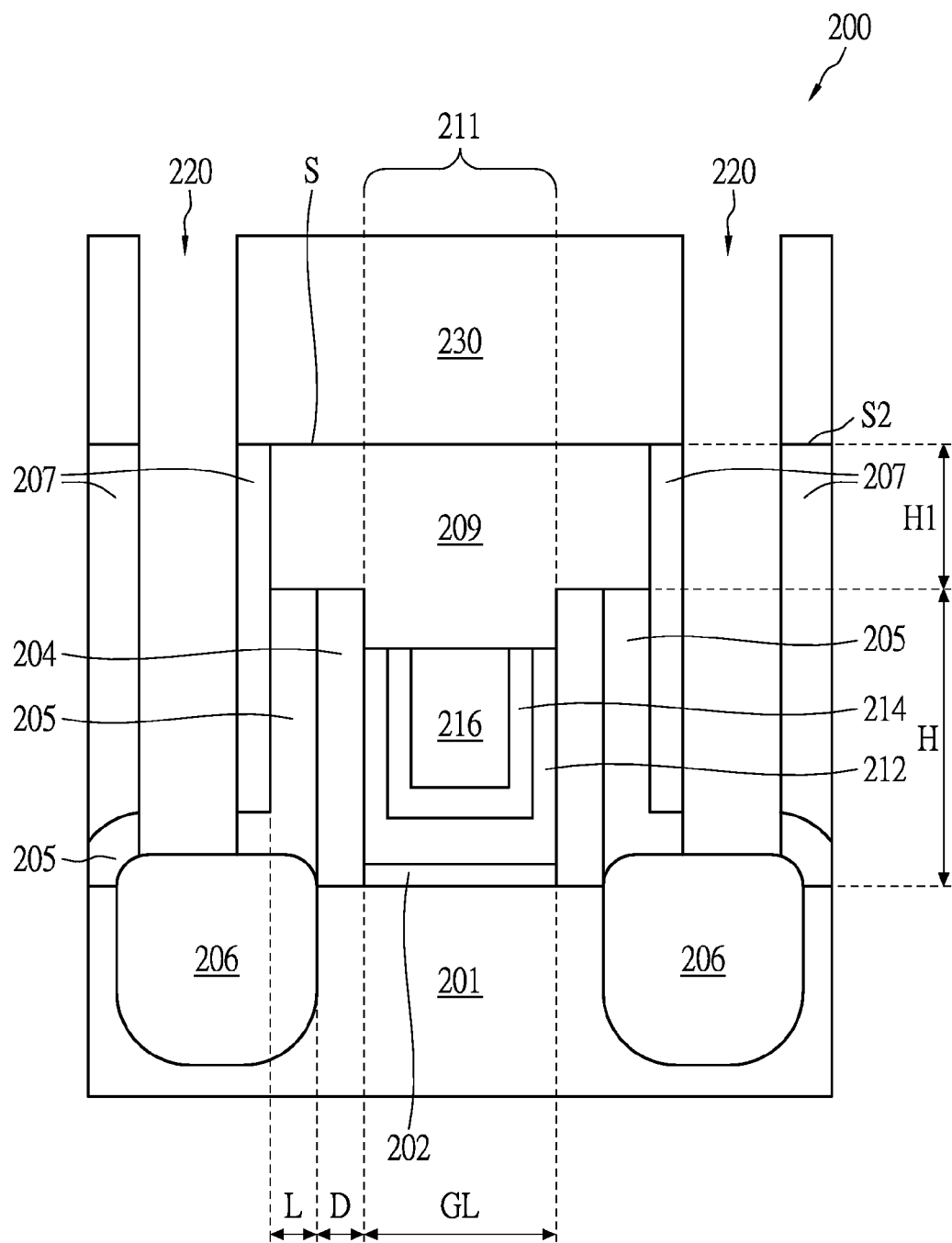
Figure 20:
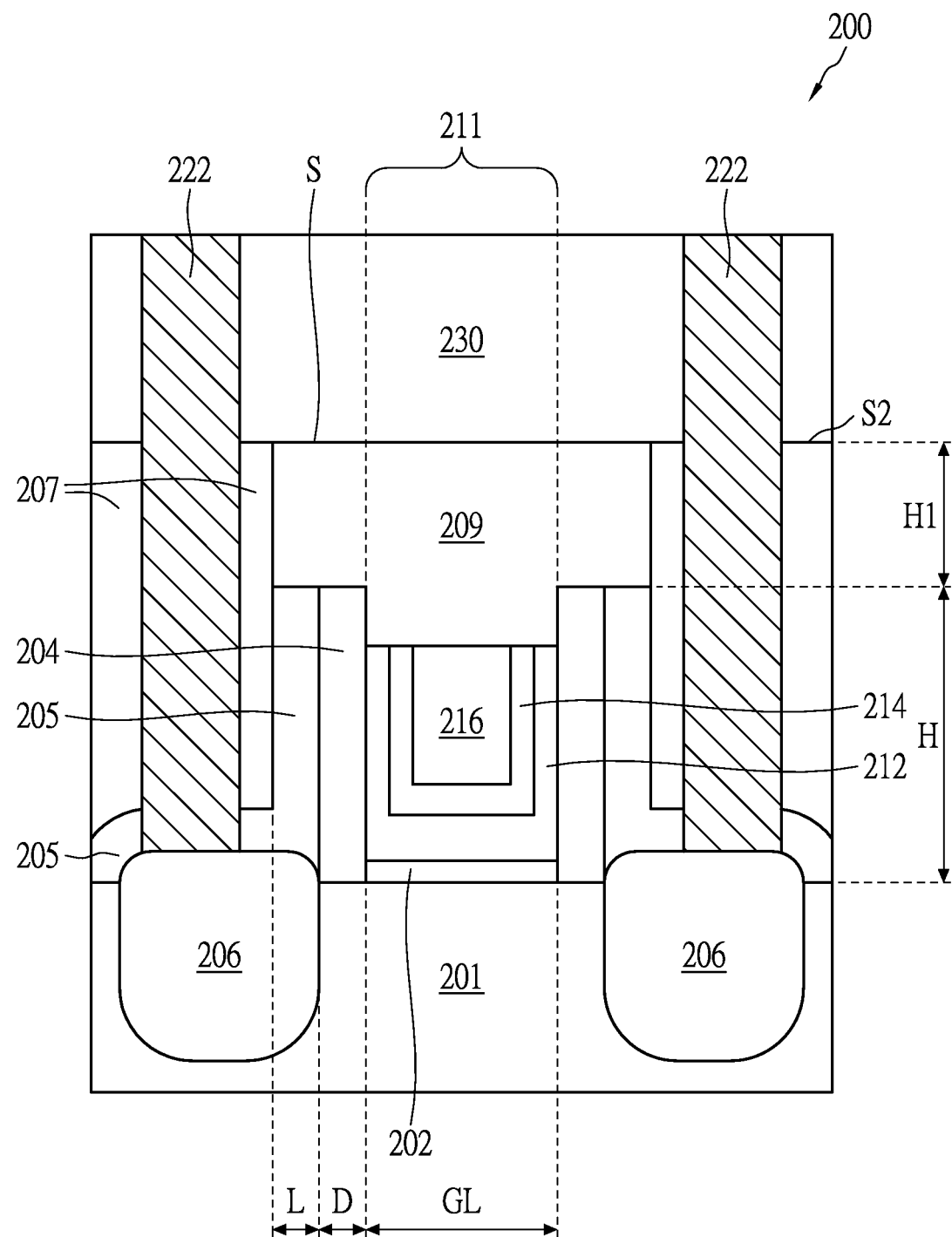

FIG. 19 and FIG. 20 illustrate a formation of conductive plug 222. In FIG. 19, a contact recess 220 is formed from an upper edge of second dielectric layer 230 to a top side of doped region 206. Contact recess 220 may penetrate through second dielectric layer 230, dielectric layer 207, and contact etch stop layer 205. Contact recess 220 may be formed by at least one etching process. In some embodiments, contact recess 220 has high aspect ratio, which means a small opening at a top and a long recess depth. Some etching processes may include a dry etching process. The dry etching process may use an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr, He and/or $CHBR_3$), iodine-containing gas, other suitable gases and/or plasmas, and/or combinations thereof. In some embodiments, the dry etching process utilizes an $O_2$ plasma treatment and/or an $O_2/N_2$ plasma treatment. In some embodiments, different etchant may be used for etching different layers. In some embodiments, a wet etching process may also form contact recess 220. The wet etching process may apply a diluted hydrofluoric acid to some intermediate semiconductor structures such as second dielectric layer 230, dielectric layer 207, and contact etch stop layer 205.

In FIG. 20, conductive plug 222 is formed by filling the contact recess 220 by some suitable processes. A filling is from a top side of doped region 206 to an upper edge of second dielectric layer 230. Conductive plug 222 may be filled with some conductive materials. In some embodiment, some suitable deposition process may be used to fill contact recess 220. A conductive plug 222 is for a voltage to apply to doped region 206. In some embodiments, conductive plug 222 contacts a top side of doped region 206. In some embodiments, a HDPCVD process is used to fill contact recess 220 by using a simultaneous deposition and etching action. In some embodiment, a conductive material may be blanket-deposited (CVD) into contact recess 220. Subsequently, a dry plasma etchback may remove some excess blanket layers. In some embodiments, a planarization, such as CMP, may also be used to remove the excess blanket layers.

Figure 21:
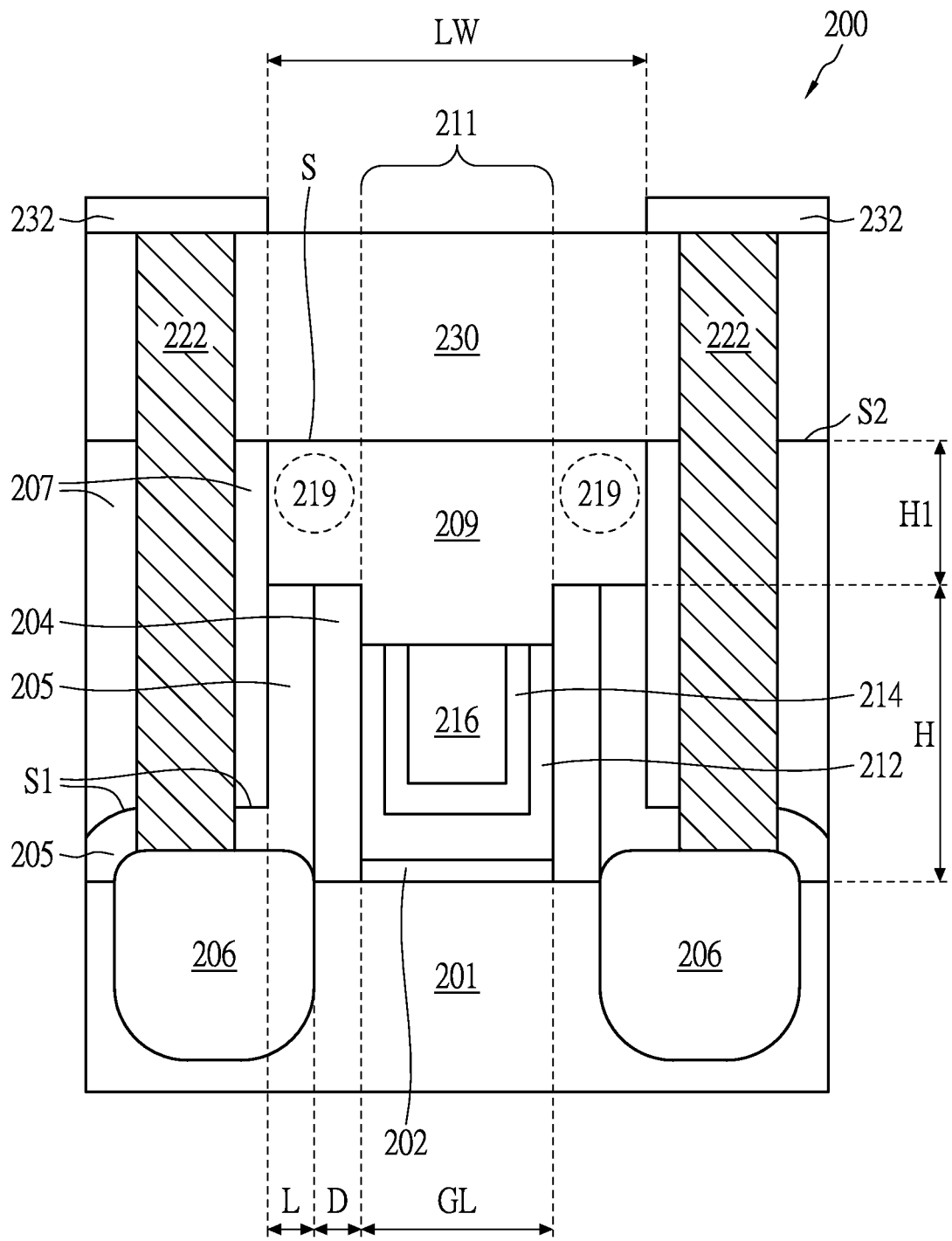

In FIG. 21, a metal contact 232 is formed on top of conductive plug 222. Metal contact 232 may be formed by suitable deposition process such as blanket-deposited (CVD). In an embodiment, a layer of photoresist is formed over metal contact 232 by a suitable process, and patterned to form a photoresist feature by a proper photolithography patterning method. The photoresist feature can then be transferred by an etching process to metal contact 232 to pattern metal contact 232. The photoresist may be stripped thereafter. Metal contact 232 is electrically connected with conductive plug 222 and doped region 206.

Some embodiments of the present disclosure provide a semiconductor device including a semiconductive substrate, a metal gate including a metallic layer proximal to the semiconductive substrate. A dielectric layer surrounds the metal gate. The dielectric layer includes a first surface facing the semiconductive substrate and a second surface opposite to the first surface. A sidewall spacer surrounds the metallic layer with a greater longitudinal height. The sidewall spacer is disposed between the metallic layer and the dielectric layer. An etch stop layer over the metal gate comprises a surface substantially coplanar with the second surface of the dielectric layer. The etch stop layer has a higher resistance to etchant than the dielectric layer. A portion of the etch stop layer is over the sidewall spacer.

In some embodiments of the present disclosure, the sidewall spacer includes a bottom landing on the semiconductive substrate and a top opposite to the bottom. A height of the sidewall spacer is measured from the bottom to the top.

In some embodiments of the present disclosure, the etch stop layer covers the top of the sidewall spacer.

In some embodiments of the present disclosure, the top of the sidewall spacer is recessed from the second surface of the dielectric layer with a predetermined distance.

In some embodiments of the present disclosure, the predetermined distance is between about 10 Å and about 700 Å.

In some embodiments of the present disclosure, the semiconductor device further includes a second dielectric layer laterally lying on the dielectric layer. The portion of the etch stop layer is between the sidewall spacer and the second dielectric layer.

In some embodiments of the present disclosure, the etch stop layer includes silicon nitride.

In some embodiments of the present disclosure, the semiconductor device further comprises a conductive plug in the dielectric layer. The conductive plug contacts a raised doped region in the semiconductive substrate.

In some embodiments of the present disclosure, the semiconductive substrate further comprises a doped region with a different conductive type than the semiconductor substrate.

In some embodiments of the present disclosure, the doped region is an epitaxial layer.

In some embodiments of the present disclosure, the metal gate further comprises a work function layer.

In some embodiments of the present disclosure, the semiconductor device further comprises contact etch stop layer.

Some embodiments of the present disclosure provide a semiconductor device including a semiconductive substrate. A dielectric layer laterally laid over the semiconductive substrate. A metal gate structure is surrounded by the dielectric layer. The metal gate structure comprises a gate length. The surface is configured to provide a contact area for a conductive plug. A nitrogen containing layer covers the metal gate structure. The nitrogen containing layer comprises a lateral width greater than the gate length of the metal gate structure.

In some embodiments of the present disclosure, the semiconductor device further comprises a sidewall spacer of the metal gate structure between the metal gate structure and the dielectric layer.

In some embodiments of the present disclosure, the sidewall spacer is covered by the nitrogen containing layer.

Some embodiments of the present disclosure provide a method for fabricating a semiconductor device. The method includes forming a semiconductive substrate; forming a replacement gate in proximity to the semiconductive substrate; forming a contact etch stop layer surrounding the replacement gate; forming a dielectric layer surrounding the etch stop layer; planarizing the dielectric layer and the etch stop layer; recessing the etch stop layer and the replacement gate; and forming a metal gate to replace the replacement gate.

In some embodiments of the present disclosure, the planarizing comprises forming an upper surface of the dielectric layer coplanar with a top surface of the etch stop layer.

In some embodiments of the present disclosure, the recessing comprises lowering the etch stop layer by a predetermined distance.

In some embodiments of the present disclosure, the predetermined distance is between about 10 Å and about 700 Å.

In some embodiments of the present disclosure, the method further includes depositing a nitrogen containing layer over the metal gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductive substrate;
a metal gate comprising a metallic layer proximal to the semiconductive substrate;
a dielectric layer surrounding the metal gate and including a first surface facing the semiconductive substrate and a second surface opposite to the first surface;
a sidewall spacer surrounding the metallic layer with a greater longitudinal height and disposed between the metallic layer and the dielectric layer, wherein the sidewall spacer includes a bottom landing on the semiconductive substrate and a top opposite to the bottom;
an etch stop layer over the metal gate and comprising a surface substantially coplanar with the second surface of the dielectric layer, wherein the etch stop layer has a higher resistance to etchant than the dielectric layer, a first portion of the etch stop layer is disposed alongside a sidewall of the sidewall spacer, a second portion of the etch stop layer is over the sidewall spacer and the first portion, and the first portion is narrower than the second portion; and
a second dielectric layer laterally lying on the dielectric layer, wherein the second portion of the etch stop layer is between the sidewall spacer and the second dielectric layer,
wherein a top of the metal gate is recessed from the top of the sidewall spacer.

2. The semiconductor device of claim 1, wherein a height of the sidewall spacer is measured from the bottom to the top.

3. The semiconductor device of claim 1, wherein the etch stop layer covers the top of the sidewall spacer.

4. The semiconductor device of claim 1, wherein the top of the sidewall spacer is recessed from the second surface of the dielectric layer with a predetermined distance.

5. The semiconductor device of claim 4, wherein the predetermined distance is between about 10 Å and about 700 Å.

6. The semiconductor device of claim 1, wherein the etch stop layer includes silicon nitride.

7. The semiconductor device of claim 1, further comprising a conductive plug in the dielectric layer, wherein the conductive plug contacts a raised doped region in the semiconductive substrate.

8. The semiconductor device of claim 1, wherein the semiconductive substrate further comprising a doped region with a different conductive type than the semiconductive substrate.

9. The semiconductor device of claim 8, wherein the doped region is an epitaxial layer.

10. The semiconductor device of claim 1, wherein the metal gate further comprises a work function layer.

11. The semiconductor device of claim 1, further comprising contact etch stop layer.

12. A semiconductor device, comprising:
a semiconductive substrate;
a dielectric layer laterally placed over the semiconductive substrate, wherein the dielectric layer includes a first surface facing the semiconductive substrate and a second surface opposite to the first surface;
a metal gate structure surrounded by the dielectric layer, wherein the metal gate structure comprises a gate length, and a top of the metal gate structure is recessed from the second surface of the dielectric layer;
a sidewall spacer between the metal gate structure and the dielectric layer, wherein a top of the metal gate structure is recessed from a top of the sidewall spacer;
a contact etch stop layer between the dielectric layer and the metal gate structure; and
a nitrogen containing layer covering the metal gate structure, wherein the nitrogen containing layer comprises a lateral width greater than the gate length of the metal gate structure, and the nitrogen containing layer covers a top of the contact etch stop layer.

13. The semiconductor device of claim 12, wherein the sidewall spacer is covered by the nitrogen containing layer.

14. A method for fabricating semiconductor device, comprising:
forming a semiconductive substrate;
forming a replacement gate in proximity to the semiconductive substrate;
forming a sidewall spacer surrounding the replacement gate;
forming a contact etch stop layer surrounding the replacement gate;
forming a dielectric layer surrounding the contact etch stop layer;
planarizing the dielectric layer;
recessing the contact etch stop layer and the replacement gate;
forming a metal gate to replace the replacement gate, wherein forming the metal gate comprises:
forming at least one metal layer over the semiconductive substrate, the contact etch stop layer and the dielectric layer; and
etching the at least one metal layer to form the metal gate; and
forming an etch stop layer over the metal gate, the contact etch stop layer and the sidewall spacer, wherein the etch stop layer is in contact with the sidewall spacer.

15. The method of claim 14, wherein the planarizing comprises forming an upper surface of the dielectric layer coplanar with a top surface of the contact etch stop layer.

16. The method of claim 14, wherein the recessing comprises lowering the contact etch stop layer by a predetermined distance.

17. The method of claim 16, wherein the predetermined distance is between about 10 Å and about 700 Å.

18. The method of claim 14, further comprising depositing a nitrogen containing layer over the metal gate.

* * * * *